US009836559B2

(12) United States Patent
Moriya et al.

(10) Patent No.: US 9,836,559 B2
(45) Date of Patent: Dec. 5, 2017

(54) SIMULATION APPARATUS, SIMULATION METHOD, AND SIMULATION PROGRAM

(71) Applicant: OMRON Corporation, Kyoto (JP)

(72) Inventors: Toshihiro Moriya, Nara (JP); Yoshiya Shibata, Ibaraki (JP); Haruna Shimakawa, Kyoto (JP); Masaki Namie, Takatsuki (JP); Yasunori Sakaguchi, Fareham (GB)

(73) Assignee: OMRON CORPORATION, Kyoto-shi (JP)

( * ) Notice: Subject to any disclaimer, the term of this patent is extended or adjusted under 35 U.S.C. 154(b) by 1114 days.

(21) Appl. No.: 14/029,855

(22) Filed: Sep. 18, 2013

(65) Prior Publication Data

US 2014/0088949 A1 Mar. 27, 2014

(30) Foreign Application Priority Data

Sep. 21, 2012 (JP) .................. 2012-207690

(51) Int. Cl.
*G06F 9/45* (2006.01)
*G06F 17/50* (2006.01)
*G05B 17/02* (2006.01)
*B25J 9/16* (2006.01)

(52) U.S. Cl.
CPC ........ *G06F 17/5009* (2013.01); *B25J 9/1612* (2013.01); *G05B 17/02* (2013.01); *G05B 2219/49123* (2013.01)

(58) Field of Classification Search
CPC .......... G05B 17/02; G05B 2219/49123; G06F 17/5009; B25J 9/1671; B25J 9/1612

USPC ........ 703/1, 7, 22; 700/97, 98; 345/419-420
See application file for complete search history.

(56) References Cited

U.S. PATENT DOCUMENTS

| 6,282,455 | B1 * | 8/2001 | Engdahl | ............. G05B 19/4184 434/72 |
| 2006/0209019 | A1 * | 9/2006 | Hu | ........................... G06F 3/016 345/156 |
| 2008/0114492 | A1 * | 5/2008 | Miegel | ................... B25J 9/1664 700/248 |

(Continued)

FOREIGN PATENT DOCUMENTS

JP H09-258815 A 10/1997

*Primary Examiner* — Eunhee Kim
(74) *Attorney, Agent, or Firm* — Metrolexis Law Group, PLLC

(57) ABSTRACT

A simulation apparatus includes a processor that executes a simulation of a control program executed on a controller. The controller controls motion of a machine that handles an object. The processor includes: a motion control device that controls motion of a virtual machine based on a motion command to move the virtual machine in a virtual space, with the virtual machine corresponding to the machine; a determination device that determines whether a volume of a region, where a work space in which the virtual machine works overlaps with the virtual object, is equal to or greater than a predetermined reference value, the virtual object being handled by the virtual machine and corresponding to the object; and a follow-up device that makes the virtual object follow the motion of the virtual machine based on the motion command when the volume is equal to or greater than the reference value.

21 Claims, 17 Drawing Sheets

(56) References Cited

U.S. PATENT DOCUMENTS

2013/0135315 A1* 5/2013 Bares .................. G06T 13/20
                                                                   345/473

* cited by examiner

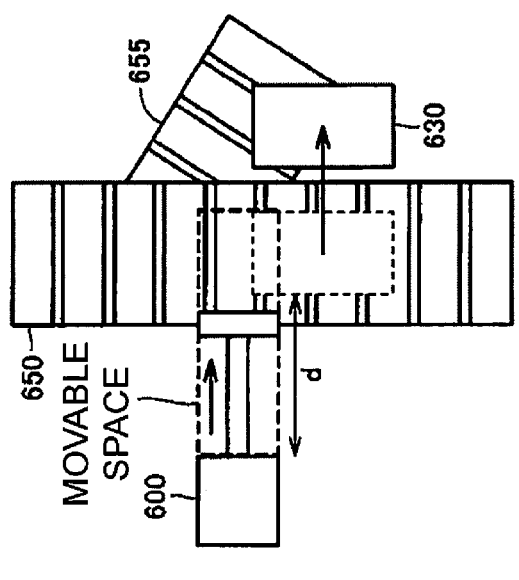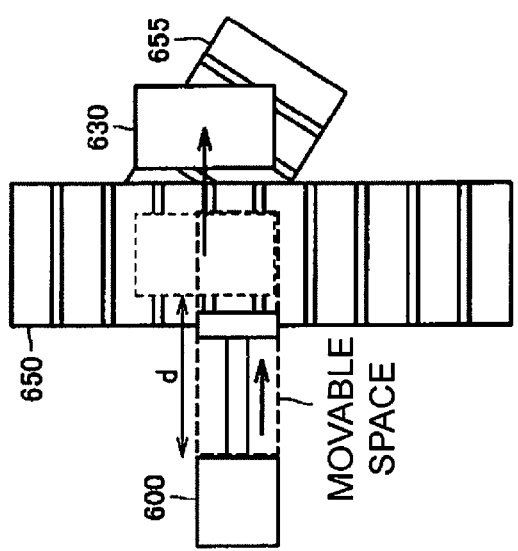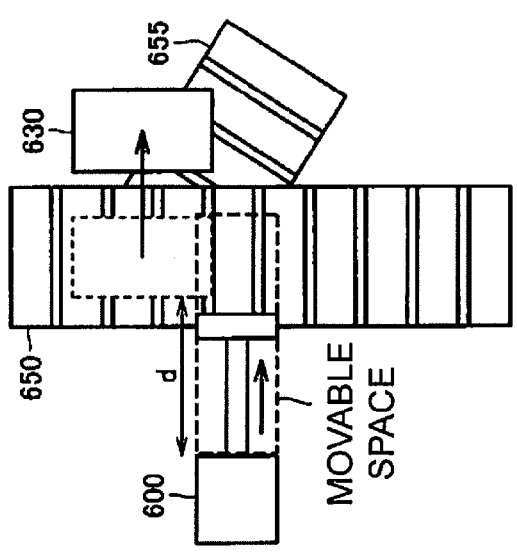

SIMULATION APPARATUS, SIMULATION METHOD, AND SIMULATION PROGRAM

CROSS REFERENCE TO RELATED APPLICATIONS

This application claims the priority of Japanese Patent Application No. 2012-207690 filed on Sep. 21, 2012, entitled "SIMULATION APPARATUS, SIMULATION METHOD, AND SIMULATION PROGRAM IMAGE PROCESSING DEVICE AND IMAGE PROCESSING PROGRAM," the entire contents of both of which are incorporated herein by reference.

BACKGROUND OF THE INVENTION

1. Technical Field

This disclosure relates to a simulation apparatus, a simulation method, and a simulation program, and more particularly relates to a simulation apparatus, a simulation method, and a simulation program which are suitable for simulating a control program executed on a controller. The controller is configured to control the motion of a machine that handles an object.

2. Related Art

Conventionally in object motion simulation, as a method to simulate the motion of a model which follows another model, there is known a technique for carrying out a follow-up movement of models based on inter-model dependency relationships extracted from the models.

For example, a kinematic chain simulation system is disclosed in JP H09-258815 A. In the kinematic chain simulation system, models of objects are defined in a computer. Master-subordinate relationships between a model which exerts actions and a model to which the actions are exerted are set to the models, and kinematic chains of the models moving according to the master-subordinate relationships are simulated. The kinematic chain simulation system includes a model extraction unit that automatically extracts models to which master-subordinate relationships should be set, a master-subordinate relationship setting unit that automatically sets the master-subordinate relationships based on relationships between the models, and a follow-up movement processing unit that makes the models move according to the master-subordinate relationships.

However, according to the technique disclosed in JP H09-258815 A, when simulating a follow-up movement of an object, which is handled by a machine and follows the motion of the machine, the simulation often results in an object designated to follow the machine actually being unable to follow the motion of the machine.

SUMMARY

An embodiment of the invention has been made in view of the above-described problem, and an object thereof is to provide a simulation apparatus, a simulation method, and a simulation program with which follow-up movement of an object handled by a machine is simulated more accurately.

In accordance with one aspect of the invention, a simulation apparatus includes a processor configured to execute the simulation of a control program executed on a controller, where the controller is configured to control the motion of a machine that handles an object. The processor includes a motion control device configured to control, in accordance with the control program, motion of a virtual machine based on a motion command to move the virtual machine in a virtual space. The virtual machine corresponds to the machine. The processor includes a determination device configured to determine, based on model data of a virtual object and model data of the virtual machine, whether or not a volume of a region, where a work space in which the virtual machine works overlaps with the virtual object is equal to or greater than a predetermined reference value. The virtual object is handled by the virtual machine and corresponds to the object. A follow-up device is configured to make the virtual object follow the motion of the virtual machine based on a motion command when the volume of the work space region is equal to or greater than the reference value.

The determination device may divide the work space into a plurality of unit regions, determine whether or not each of the divided unit regions includes the virtual object, and calculate a volume of a portion of the work space occupied by the virtual object based on the number of the unit regions determined to include the virtual object.

The determination device may divide the virtual object into a plurality of unit regions, determine whether or not each of the divided unit regions is included in the work space, and calculate a volume of a portion of the virtual object overlapped with the work space based on the number of the unit regions determined to be included in the work space.

The reference value may be defined for each piece of the model data of the virtual object. The work space may include a movable range of the virtual machine, the movable range being determined in advance to correspond to a movable range of the machine.

In accordance with another aspect of the invention, a simulation method is provided that is performed on a computer. The computer includes a processor configured to execute the simulation of a control program executed on a controller, the controller configured to control motion of a machine that handles an object. The simulation method includes the steps of: causing the processor to control, following the control program, the motion of the virtual machine based on a motion command to move a virtual machine in a virtual space, the virtual machine corresponding to the machine; causing the processor to determine, based on model data of a virtual object and model data of the virtual machine, whether or not the volume of a region where a work space in which the virtual machine works overlaps with the virtual object is equal to or greater than a predetermined reference value, the virtual object being handled by the virtual machine and corresponding to the object; and causing the processor to make the virtual object follow the motion of the virtual machine based on the motion command when the volume is equal to or greater than the reference value.

In accordance with still another aspect of the present invention, a simulation program is provided that is executed by a computer. The computer includes a processor configured to execute the simulation of a control program executed on a controller. The controller is configured to control the motion of a machine that handles an object. The simulation program causes the processor to execute the steps of: controlling, in accordance with the control program, the motion of a virtual machine based on a motion command to move the virtual machine in a virtual space, the virtual machine corresponding to the machine; determining, based on model data of a virtual object and model data of the virtual machine, whether or not the volume of a region where a work space in which the virtual machine works overlaps with the virtual object is equal to or greater than a predetermined reference value, the virtual object being handled by the virtual machine and corresponding to the object; and making the virtual object follow the motion of the virtual machine based on the motion command when the volume is equal to or greater than the reference value.

In accordance with yet another aspect of the invention, a simulation apparatus includes a processor configured to execute the simulation of a control program executed on a controller, where the controller is configured to control the motion of a machine that handles an object. The processor includes a motion control device configured to control, in accordance with the control program, the motion of a virtual machine based on a motion command to move the virtual machine in a virtual space. The virtual machine corresponds to the machine. The processor includes a determination device configured to determine, based on model data of a virtual object and model data of the virtual machine, whether or not a surface area of a portion of the virtual object where a work space in which the virtual machine works overlaps with the virtual object is equal to or greater than a predetermined reference value. The virtual object is handled by the virtual machine and corresponds to the object. The processor further includes a follow-up device configured to make the virtual object follow the motion of the virtual machine based on the motion command when the surface area is equal to or greater than the reference value.

In accordance with yet another aspect of the invention, a simulation apparatus includes a processor configured to execute the simulation of a control program executed on a controller. The controller is configured to control the motion of a machine that handles an object. The processor includes a motion control device configured to control, in accordance with the control program, the motion of a virtual machine based on a motion command to move the virtual machine in a virtual space. The virtual machine corresponds to the machine. The processor includes a determination device configured to determine, based on model data of a virtual object and model data of the virtual machine, whether or not a volume of a region where a work space in which the virtual machine works does not overlap with the virtual object is less than a predetermined reference value. The virtual object is handled by the virtual machine and corresponds to the object. The processor further includes a follow-up device configured to make the virtual object follow the motion of the virtual machine based on the motion command when the volume is less than the reference value.

These aspects of the invention make it possible to more accurately simulate follow-up movement of an object that is handled by a machine.

BRIEF DESCRIPTION OF THE DRAWINGS

FIGS. 16A to 16C are diagrams for illustrating states of simulation of a comparative example;

DETAILED DESCRIPTION

Figure 1:
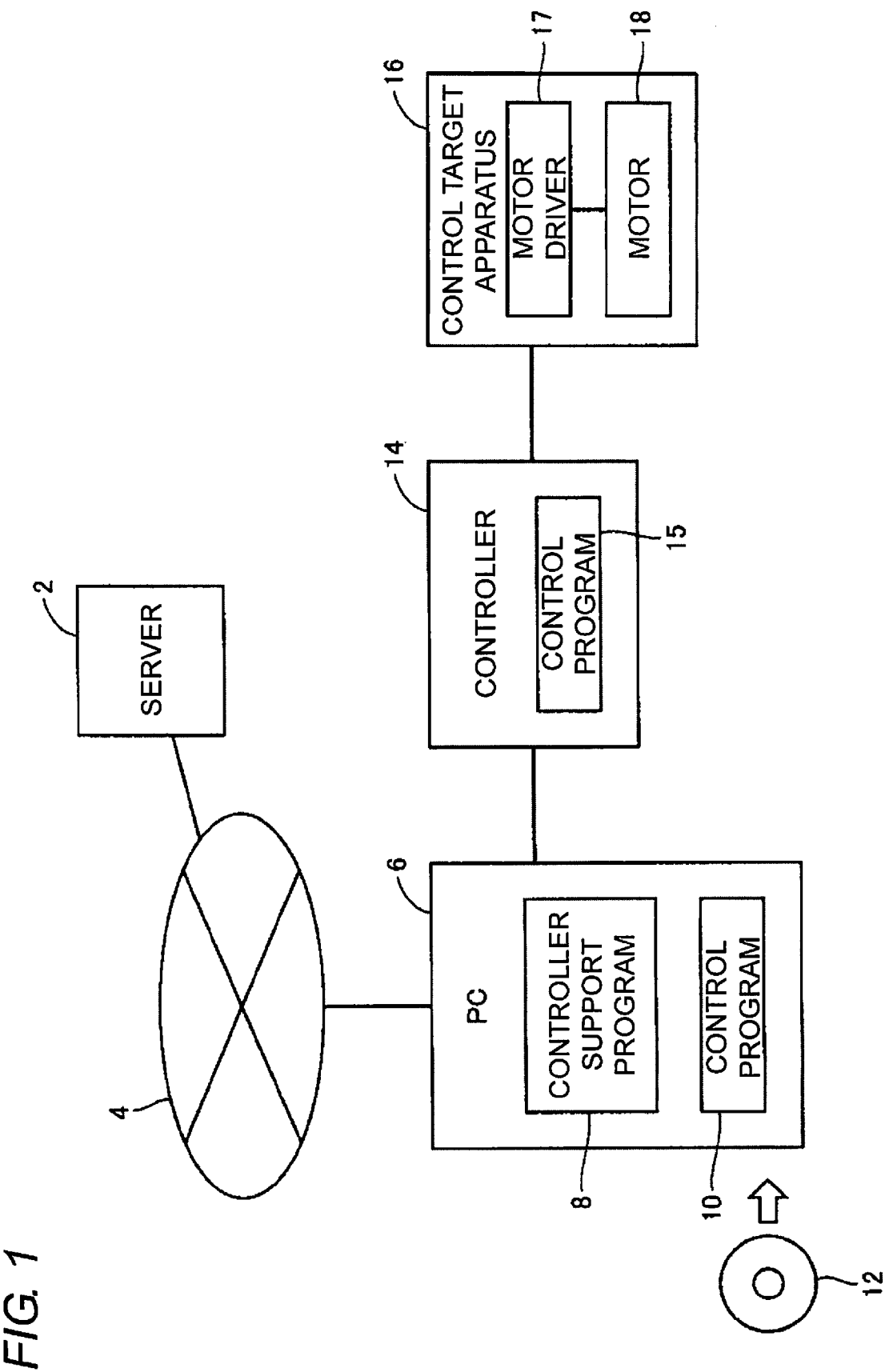
FIG. 1 is a diagram for illustrating a configuration of a control system according to a first embodiment.

Referring to the drawings, embodiments of the invention will be described below. In the following description, like components are denoted by like reference numerals. The names and functions of the components are also the same. Detailed descriptions thereof are therefore not repeated.

First Embodiment

<Overall Configuration of Control System>

FIG. 1 is a diagram for illustrating a configuration of a control system according to a first embodiment. With reference to FIG. 1, the control system according to the first embodiment has a server 2, a network 4, a PC (Personal Computer) 6, a controller 14, and a control target apparatus 16.

The server 2 is connected to the PC 6 via the network 4. The PC 6 is configured to be able to communicate with the controller 14 that controls the control target apparatus 16.

The PC 6 corresponds to a simulation apparatus in one embodiment. A controller support program 8 including a simulation program is installed on the PC 6, and a control program 10 created by a user is stored on the PC 6. A CD-ROM (Compact Disc-Read Only Memory) 12 stores the controller support program 8. The controller support program 8 installed on the PC 6 is installed from this CD-ROM 12.

The controller 14 controls the motion of the control target apparatus 16. For example, a PLC (Programmable Logic Controller) is used for the controller 14. The PLC has a so-called motion control function. The controller 14 stores the control program 15 which defines control contents for the control target apparatus 16. The controller 14 executes a loop of the control program 15 in each control cycle. The control program 15 stored in the controller 14 is copy data which is a copy of the control program 10 stored in the PC 6, and the control program 15 is sent from the PC 6

The control target apparatus 16 includes a motor 18 such as a servo motor and a stepping motor, and a motor driver 17 for driving the motor.

The motor driver 17 supplies a driving current to the motor 18. The motor driver 17 is provided with a position command value for each control cycle by the controller 14 executing the control program 15, and supplies to the motor 18 the driving current corresponding to the position command value. For example, if the motor 18 is a servo motor, the motor 18 is provided with an encoder which detects an actual value of a rotational position of the motor 18. The actual value of the rotational position of the motor is used by the motor driver 17 for feedback control.

Although a case where a simulation program is installed in the PC 6 via the CD-ROM 12 has been described above, the mode of installation is not limited thereto. For example, the simulation program may be downloaded from the server 2 to the PC 6 via the network 4. This also applies to a control program.

<Hardware Configuration of PC>

Figure 2:
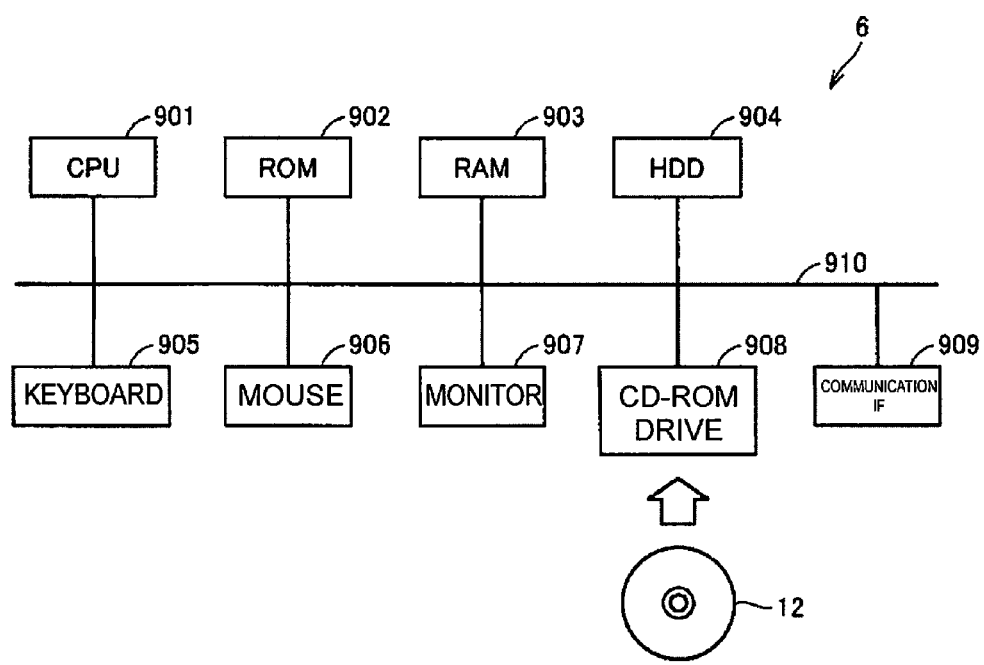
FIG. 2 is a diagram for illustrating a hardware configuration of a PC 6 according to the first embodiment.

FIG. 2 is a diagram for illustrating a hardware configuration of the PC 6 according to the first embodiment. With reference to FIG. 2, the PC 6 includes a CPU 901 as a processing device, a ROM 902, a RAM 903, and an HDD 904 as storage devices, a CD-ROM drive 908 as a data reading unit, a communication IF 909 as a communication device, a monitor 907 as a display device, and a keyboard 905 and a mouse 906 as input devices. These units are connected with one another via an internal bus 910.

The CPU 901 controls each unit of the PC 6 by reading programs and data stored in the ROM 902, the RAM 903, and the HDD 904, and executing the programs. The CPU 901 is typically a microprocessor. The hardware may be an FPGA (Field Programmable Gate Array), an ASIC (Application Specific Integrated Circuit), or a circuit having an arithmetic operation function other than the CPU.

The HDD 904 is typically a non-volatile magnetic memory and stores the simulation program which is read from the CD-ROM 12 by the CD-ROM drive 908. The HDD 904 also stores the control program 15.

The simulation program may be stored in a storage medium other than the CD-ROM 12, and may be read by the CPU 901 via a memory interface (IF) interfacing with the storage medium. For example, the simulation program may be read from a DVD-ROM via a DVD (Digital Versatile Disk)-ROM drive, or the simulation program may be read from a USB memory via a USB (Universal Serial Bus) interface.

The CPU 901 reads the controller support program 8, which is stored in the HDD 904, into the RAM 903 and executes the controller support program 8.

The RAM 903 is a volatile memory and functions as a working memory. In general, the ROM 902 stores programs such as an operating system (OS).

The communication interface (IF) 909 typically supports a general-purpose communication protocol, such as an Ethernet (registered trademark) and a USB. The communication IF 909 provides data communication with the server 2 and the controller 14 via the network 4.

The monitor 907 is configured by a liquid crystal display, a CRT (Cathode Ray Tube), an organic EL (Electroluminescence) display, a plasma display, and the like, and displays a processing result by the PC 6, or the like. The keyboard 905 receives key inputs by a user. The mouse 906 receives pointing operations by the user.

<Functional Configuration>

Figure 3:
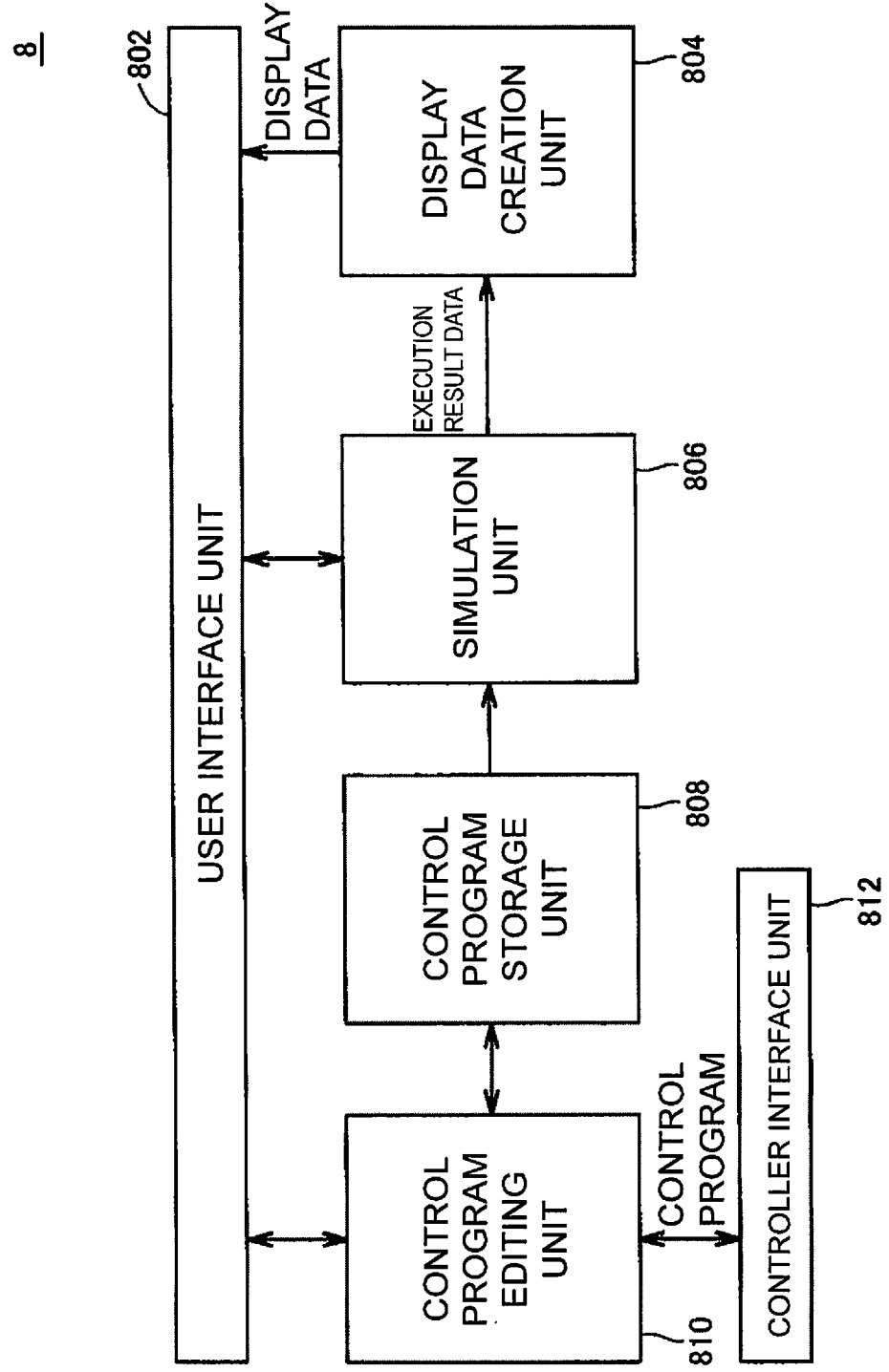
FIG. 3 is a functional block diagram which is implemented by a CPU executing a controller support program.

FIG. 3 is a block diagram which is implemented by the CPU 901 executing the controller support program 8. FIG. 3 shows a user interface unit 802, a display data creation unit 804, a simulation unit 806, a control program storage unit 808, a control program editing unit 810, and a controller interface unit 812.

The user interface unit 802 creates window screen contents displayed on the monitor 907 of the PC 6, and receives user operations through the keyboard 905 and the mouse 906.

The control program editing unit 810 receives inputs of and editing commands for the control program by the user. The control program is compiled if compilation is necessary for execution of the control program. The created control program is sent to the controller 14 via the controller interface unit 812. The created control program is also stored in the control program storage unit 808, which is a predetermined region in the HDD 904. The control program editing unit 810 can read out the control program 15 stored in the controller 14 via the controller interface unit 812 and edit the control program 15.

The simulation unit 806 is a simulator for the controller 14. The simulation unit 806 simulates operations of the controller 14 to execute the control program 15 according to the control program 10 stored in the control program storage unit 808, and calculates position command values to be output by the controller 14 for each control cycle.

The simulation unit 806 is also capable of simulating how an incoming external signal affects the operation of the control program 15 and how a change, which is caused by the execution of the control program 15, in internal states of the controller 14 such as contents stored in the memory of the controller 14 affects the operation of the control program 15.

The simulation unit 806 also receives user commands for the execution of the simulation via the user interface unit 802. That is, the user interface unit 802 also serves as a device that receives user commands for the simulation unit 806.

The display data creation unit 804 creates display data to show the temporal change in the execution result data created by the simulation unit 806. The display data creation unit 804 displays the created display data on the monitor 907 of the PC 6 in the forms of graphs, characters, and 3D representations by sending the display data to the user interface unit 802.

<Functional Configuration of Simulation Unit>

Figure 4:
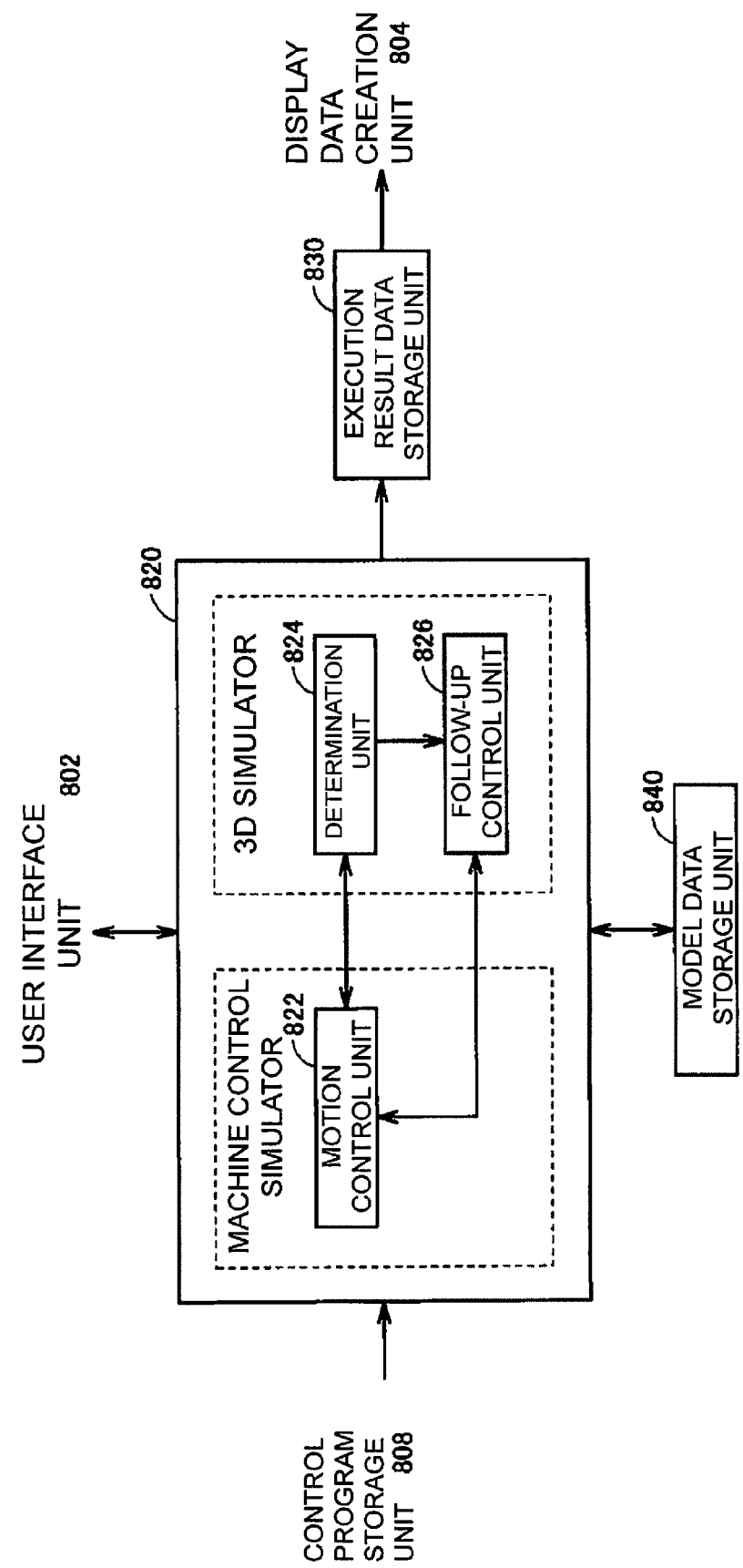
FIG. 4 is a detailed block diagram for illustrating functions of a simulation unit according to the first embodiment.

FIG. 4 is a detailed block diagram for illustrating functions of the simulation unit 806 according to the first embodiment.

A simulation control unit 820 reads the control program 10 from the control program storage unit 808, and executes a simulation of the control program 10 or re-executes the simulation from the midpoint. Along with this, the simulation control unit 820 controls a flow between an execution result data storage unit 830 and a model data storage unit 840. Each of the execution result data storage unit 830 and the model data storage unit 840 is a functional unit implemented in the RAM 903 or HDD 904.

The simulation control unit 820 includes, as its main functional units, a motion control unit 822, a determination unit 824, and a follow-up control unit 826. The motion control unit 822 is a functional unit that is implemented by the simulation unit 806 executing a machine control simulator, described below. The determination unit 824 and the follow-up control unit 826 are functional units that are implemented by the simulation unit 806 executing a 3D simulator, also described below.

According to the control program 10, the motion control unit 822 controls the motion of a virtual machine based on a motion command to move the virtual machine corresponding to a machine in a virtual space.

Based on model data of the virtual object, which is handled by the virtual machine and corresponds to an object, and model data of the virtual machine, the determination unit 824 determines whether or not a volume of a region where a work space in which a virtual machine works (a below-described holding space in the first embodiment) overlaps with a virtual object is equal to or greater than a predetermined reference value. More specifically, the determination unit 824 divides the work space into a plurality of unit regions, and determines whether or not each of the divided unit regions includes the virtual object. The determination unit 824 then calculates a volume of a portion of the work space occupied by the virtual object based on the number of the unit regions determined to include the virtual object. The work space is a space in which a machine can work on an object.

The follow-up control unit 826 makes the virtual object follow the motion of the virtual machine which moves by the motion commands based on the determination result that the volume is equal to or greater than the reference value.

The execution result data storage unit 830 stores execution result data used for display.

The model data storage unit 840 stores model data, which include models of objects in the real space such as a robot, a workpiece, a conveyer, and a stand. More specifically, the model data storage unit 840 has model data of shapes, characteristics of motion, functions, performance, positions, directions, and the like of virtual objects in a virtual space which correspond to the objects in the real space.

<Flow of Simulation Control>
(Overview)

Figure 5:
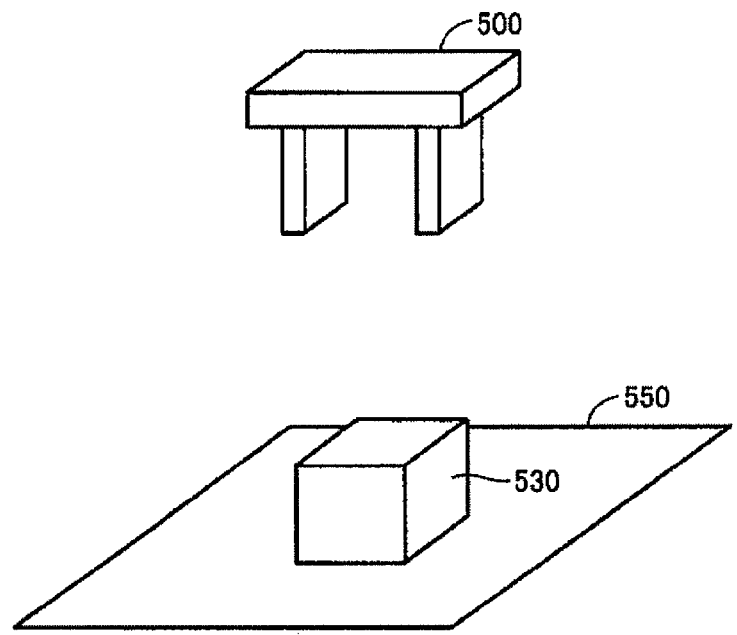
FIG. 5 is a diagram showing a 3D space of simulation according to the first embodiment.

FIG. 5 is a diagram showing a 3D space used in the simulation according to the first embodiment. With reference to FIG. 5, in the first embodiment, in the 3D space which is a virtual space corresponding to the real space, there are arranged a virtual robot 500 which corresponds to a robot in the real space, a virtual workpiece (a virtual object) 530 which corresponds to a workpiece (an object) in the real space, and a virtual stand 550 which corresponds to a stand on which the workpiece is placed in the real space. The robot is typically a robot hand that has a holding mechanism for holding a workpiece.

The simulation unit 806 executes a 3D simulator and a machine control simulator while referring to the model data of the virtual machine and the virtual object.

The 3D simulator displays objects (in the first embodiment, the virtual robot 500, the virtual workpiece 530, and the virtual stand 550) in the 3D space based on a result acquired in a data trace. The 3D simulator also determines whether or not a follow-up condition is satisfied that makes the virtual workpiece 530 handled by the virtual robot 500 follow the motion of the virtual robot 500. In other words, the 3D simulator determines whether or not the virtual workpiece 530 handled by the virtual robot 500 follows the motion of the virtual robot 500. If the follow-up condition is satisfied, the 3D simulator starts a follow-up movement control which makes the virtual workpiece 530 follow the motion of the virtual robot 500. In the case where the follow-up movement control is started, the 3D simulator calculates a state of the virtual workpiece 530 which follows the virtual robot 500.

The machine control simulator controls a virtual machine (in the first embodiment, the virtual robot 500 or the virtual stand 550) in the 3D space. More specifically, the machine control simulator calculates command values for the control of the virtual machine and also calculates the motion of the virtual machine for the command values. The machine control simulator calculates the motion of the virtual machine based on, for example, motion commands sent from a user via the user interface unit 802 (or motion commands output by a program).

Control in the simulation according to the first embodiment is generally carried out by the 3D simulator and the machine control simulator executing the following processing. First, (1) the machine control simulator transmits the calculated state of the virtual machine and the virtual object to the 3D simulator. Next, (2) the 3D simulator displays the virtual machine and the virtual object in the 3D space based on the received states of the virtual machine and the virtual object. Then, (3) the 3D simulator determines whether or not the follow-up condition that makes the virtual object follow the virtual machine is satisfied. If it determines that the follow-up condition is satisfied, the follow-up movement control is started under which the virtual object follows the motion of the virtual machine.

States in the simulation according to the first embodiment will be described below in time series.

Figure 6C:
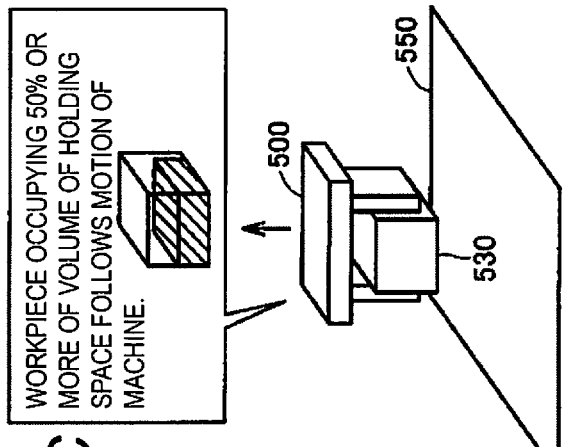
FIGS. 6A to 6C are diagrams showing states of the simulation according to the first embodiment.
Figure 6B:
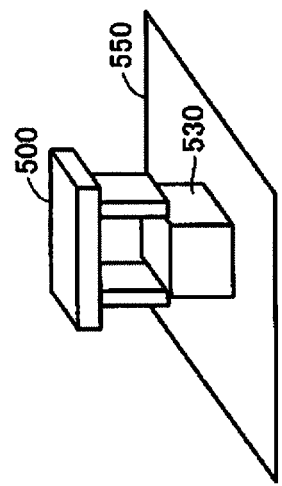
Figure 6A:
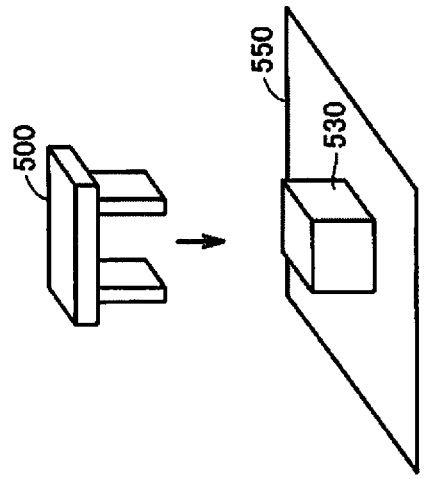

FIGS. 6A to 6C are diagrams showing states in the simulation according to the first embodiment.

With reference to FIGS. 6A to 6C, following a motion command, the virtual robot 500 moves toward the bottom of the figure to hold the virtual workpiece 530 placed on the virtual stand 550 (the state in FIG. 6A). When a certain time has passed from the state in FIG. 6A, the virtual robot 500 moves closer to the virtual workpiece 530 to hold the virtual workpiece 530 (the state in FIG. 6B). When a certain time has passed from the state in FIG. 6B, a holding space (for holding an object) sandwiched between holding arms of the virtual robot 500 overlaps with the virtual workpiece 530. If the volume of a portion of the holding space occupied by the virtual workpiece 530 is equal to or greater than a predetermined reference value (e.g., equal to or greater than 50%), the follow-up condition which makes the virtual workpiece 530 follow the motion of the virtual robot 500 is satisfied. When the virtual robot 500 moves toward the upper side in the figure, the virtual workpiece 530 moves in the direction of an arrow (upward) in the figure following the motion of the virtual robot 500 (the state in FIG. 6C). Then, a simulation result showing that the virtual robot 500 holds the virtual workpiece 530 is displayed. The holding space of the virtual robot 500 is determined in advance to correspond to a holding space of the robot in the real space.

(Flow Chart)

Figure 7:
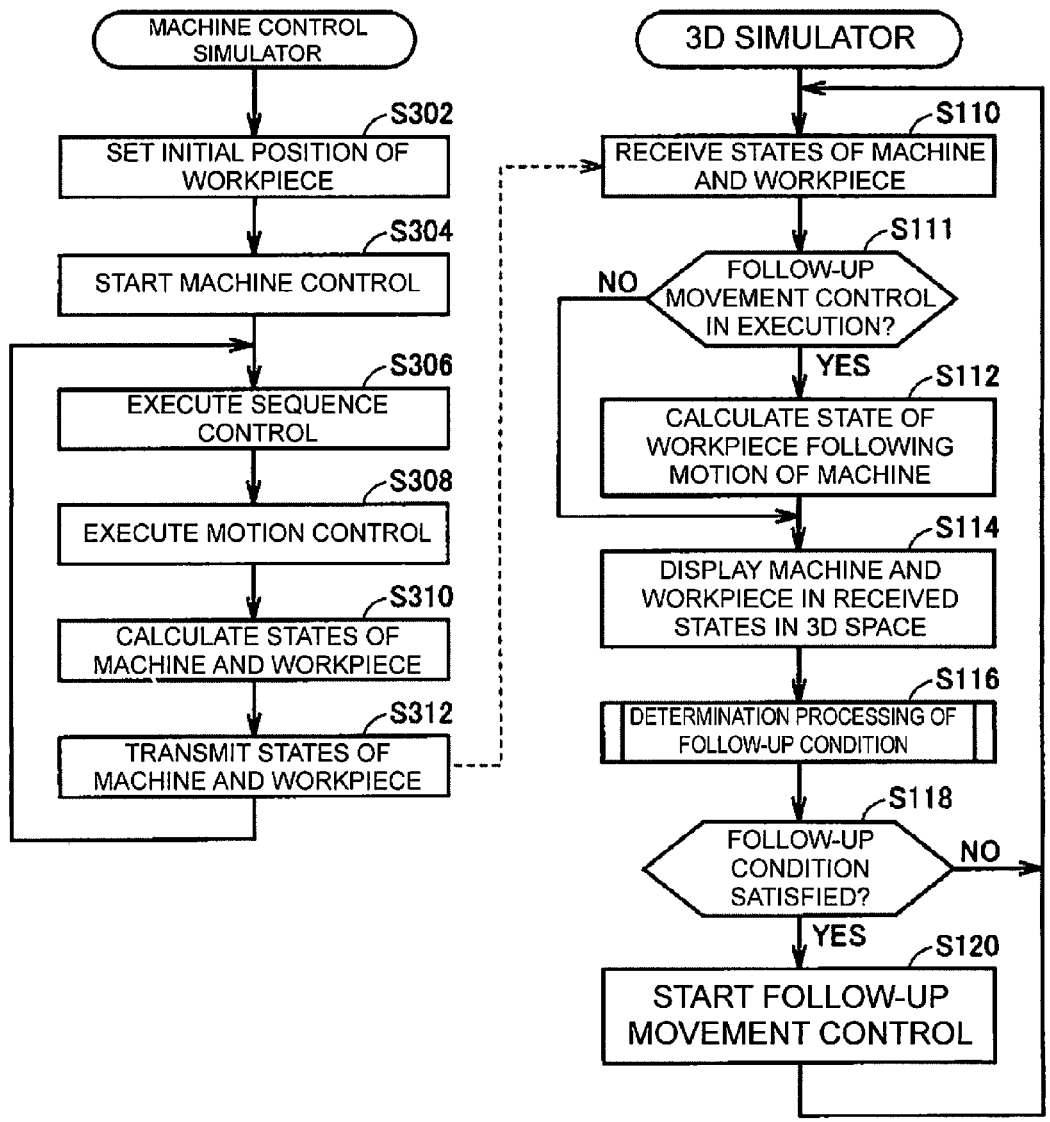
FIG. 7 is a flowchart showing a flow of control of the simulation according to the first embodiment.

FIG. 7 is a flowchart showing a flow of control of the simulation according to the first embodiment. Each step shown in FIG. 7 is basically carried out by the CPU 901 executing a simulation of the control program 10.

With reference to FIG. 7, the simulation unit 806 sets an initial position of the virtual workpiece (the virtual workpiece 530 in FIGS. 6A to 6C) by executing the machine control simulator (step S302). By taking FIGS. 6A to 6C as an example, an initial position of the virtual workpiece 530 is set in proximity to the center of the virtual stand 550.

Next, the simulation unit 806 starts the control of a virtual machine (the virtual robot 500 in FIGS. 6A to 6C) following the control program 10 by executing the machine control simulator (step S304).

The simulation unit 806 executes a sequence control based on a motion command for the virtual machine by executing the machine control simulator (step S306). Next, the simulation unit 806 executes a motion control based on the motion command for the virtual machine by executing the machine control simulator (step S308). More specifically, the simulation unit 806 calculates the command values based on the motion command from the user via the user interface unit 802.

Then, the simulation unit 806 calculates the states of the virtual machine and the virtual workpiece as a result of the motion control (step S310), and transmits information showing the calculated states of the virtual machine and the virtual workpiece to the 3D simulator (step S312). The simulation unit 806 repeats the processes from step S306 by executing the machine control simulator.

Next, the simulation unit 806 receives the information showing the states of the virtual machine and the virtual workpiece sent from the machine control simulator by executing the 3D simulator (step S110).

Next, the simulation unit 806 determines whether or not the follow-up movement control, under which the virtual workpiece follows the motion of the virtual machine, is executed by executing the 3D simulator (step S111). More specifically, the simulation unit 806 determines whether or not the follow-up movement control in step S120, which will be described later, has been started.

If the follow-up movement control has not been started (NO in step S111), the simulation unit 806 executes the processes from step S114, which will be described later. On the other hand, if the follow-up movement control has already been started (YES in step S111), the simulation unit 806 calculates the state of the virtual workpiece following the virtual machine (the state of the virtual workpiece which is moved along with the motion of the virtual machine) by executing the 3D simulator (step S112).

The simulation unit 806 then displays the virtual machine and the virtual workpiece in the 3D space on the monitor 907 based on the states of the virtual machine and the virtual workpiece (step S114). In this process, execution result data necessary for the display is transferred to the display data creation unit 804.

When the above-described sequence control and motion control are performed, the states shown in FIGS. 6A to 6C are displayed on the monitor 907. More specifically, if the follow-up movement control, under which the virtual workpiece follows the virtual robot 500, has not been started yet (NO in step S111), for the virtual workpiece 530 placed in proximity to the center of the virtual stand 550, a state in which the virtual robot 500 moves toward the bottom of FIGS. 6A to 6C (the state in FIG. 6A) or a state in which the virtual robot 500 comes close to the virtual workpiece 530 (the state in FIG. 6B) is displayed on the monitor 907. That is, a state in which the virtual workpiece 530 does not follow the virtual robot 500 is displayed on the monitor 907.

On the other hand, in the case where the follow-up movement control has already been started in step S120, which will be described later (YES in step S111), a state in which the virtual workpiece 530 follows (is held by) the virtual robot 500 (the state in FIG. 6C) is displayed on the monitor 907.

With reference to FIG. 7, the simulation unit 806 executes a determination process to determine whether or not the follow-up condition is satisfied for the virtual workpiece to follow the motion of the virtual machine by executing the 3D simulator (step S116).

Figure 8:
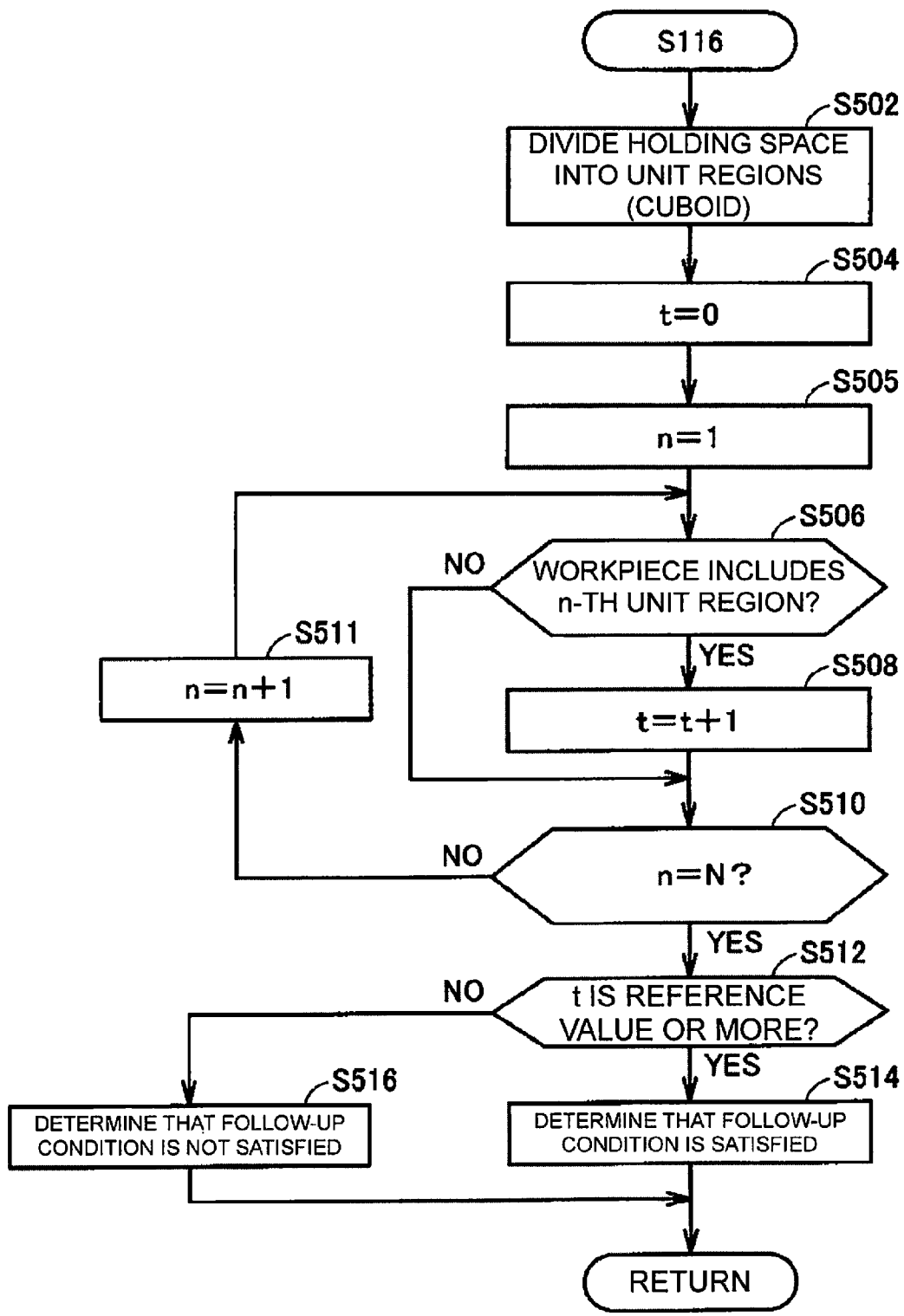
FIG. 8 is a flowchart showing a flow of determination processing of follow-up conditions according to the first embodiment.

FIG. 8 is a flowchart showing a flow of a determination process of the follow-up conditions according to the first embodiment. The follow-up conditions for the virtual workpiece 530 to follow the motion of the virtual robot 500 shown in FIGS. 6A to 6C will be described below.

With reference to FIG. 8, by executing the 3D simulator, the simulation unit 806 divides the holding space, which is sandwiched by two holding arms of the virtual robot 500, into a plurality of unit regions (e.g., a cuboid) with a predetermined size (step S502).

Figure 9:
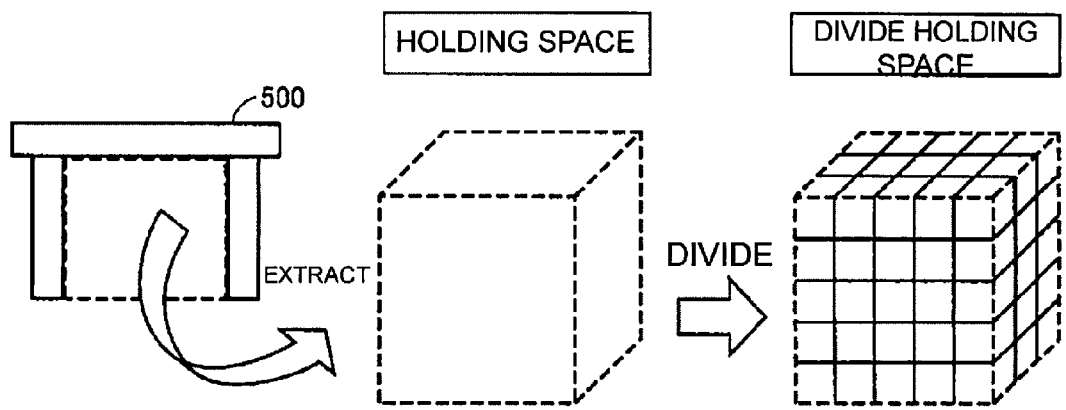
FIG. 9 is a diagram for illustrating a division method of a holding space of a virtual robot according to the first embodiment.

FIG. 9 is a diagram for illustrating a division method of the holding space of the virtual robot 500 according to the first embodiment.

With reference to FIG. 9, the simulation unit 806 extracts the holding space of the virtual robot 500 based on the model data of the virtual robot 500. The simulation unit 806 divides the extracted holding space into a plurality of unit regions. This example shows a case where the holding space is divided into 75 unit regions.

Referring again to FIG. 8, the simulation unit 806 sets a variable t, which indicates the number of the unit regions including the virtual workpiece 530, to 0 (step S504). That is, the variable t indicates the volume of a portion of the holding space occupied (overlapped) by the virtual workpiece 530. Therefore, if the entire holding space is occupied by the virtual workpiece 530, the value of the variable t is 75. If the virtual workpiece 530 does not exist in the holding space (if the virtual workpiece 530 is not included in the holding space at all), the value of the variable t is 0.

Next, the simulation unit 806 sets 1 to a variable n, which is stored in a storage device (e.g., the RAM 903) (step S505). In the first embodiment, the RAM 903 holds, as a variable N, the number of unit regions into which the holding space is divided. In other words, the variable N indicates the total volume of the holding space.

Next, the simulation unit 806 determines whether or not the n-th unit region includes the virtual workpiece 530 (i.e., whether or not it is occupied by the virtual workpiece 530) (step S506).

Figure 10:
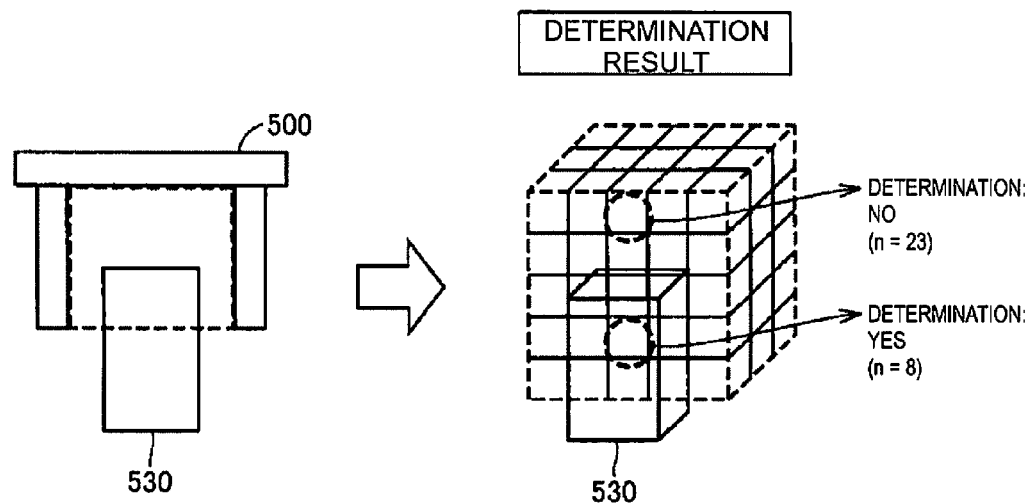
FIG. 10 is a diagram for illustrating a determination processing method in step S506 shown in FIG. 8.

FIG. 10 is a diagram for illustrating a determination processing method in step S506 shown in FIG. 8.

With reference to FIG. 10, the simulation unit 806 determines that, for example, the 8th (n=8) unit region includes the virtual workpiece 530 (determination: YES), and the 23rd (n=23) unit region does not include the virtual workpiece 530 (determination: NO).

Referring again to FIG. 8, if the n-th unit region does not include the virtual workpiece 530 (NO in step S506), the simulation unit 806 executes the processing in step S510. On the other hand, if the n-th unit region includes the virtual workpiece 530 (YES in step S506), the simulation unit 806 increments the value of the variable t (step S508) and executes the processing in step S510.

Next, the simulation unit 806 determines whether or not the variable n matches the variable N (step S510). More specifically, the simulation unit 806 determines whether or not the determination processing in step S506 is executed for all unit regions.

If the value of the variable n and the value of the variable N do not match (NO in step S510), the simulation unit 806 increments the value of the variable n (step S511) and repeats the processing from step S506. On the other hand, if the value of the variable n matches the value of the variable N (YES in step S510), the simulation unit 806 determines whether or not the value of the variable t is equal to or greater than a predetermined reference value (step S512). More specifically, for example, if the follow-up condition for the virtual workpiece 530 to follow the motion of the virtual robot 500 is that the virtual workpiece 530 occupies 50% or more of the volume of the holding space, the reference value is set to half the volume of the holding space. In this case, the reference value is set to 38 since the volume of the holding space is 75.

If the value of the variable t is equal to or greater than the reference value (YES in step S512), the simulation unit 806 determines that the follow-up condition is satisfied (step S514) and returns the process to the main process (Return). On the other hand, if the value of the variable t is not equal to or greater than (i.e., is less than) the reference value (NO in step S512), the simulation unit 806 determines that the follow-up condition is not satisfied (step S516) and returns the process to the main process (Return).

Although the case has been described where the simulation unit 806 determines whether or not the follow-up condition is satisfied by calculating the volume of a portion of the holding space occupied by the virtual workpiece 530, the determination may be made by calculating the volume of a portion of the holding space not occupied does not occupy (not overlapped) by the virtual workpiece 530. More specifically, if it is determined that the n-th unit region includes the virtual workpiece 530, the simulation unit 806 increments a variable i, which indicates the number of unit regions that do not include the virtual workpiece 530. In this case, however, the simulation unit 806 determines that the follow-up condition is satisfied if the value of the variable i is less than the reference value, and that the follow-up condition is not satisfied if the value of the variable i is equal to or greater than the reference value.

Referring again to FIG. 7, the simulation unit 806 determines, by executing the 3D simulator, whether or not the follow-up condition is satisfied based on the determination result in step S116 (step S118). In other words, the simulation unit 806 determines whether or not the virtual workpiece follows the motion of the virtual machine. If the follow-up condition is satisfied (YES in step S118), the simulation unit 806 starts the follow-up movement control under which the virtual workpiece follows the motion of the virtual machine (step S120), and executes the processing from step S110.

On the other hand, if the follow-up condition is not satisfied (NO in step S118), the simulation unit 806 executes the processing from step S110. That is, the simulation unit 806 executes the processing from step S110 without starting the follow-up movement control described above.

In step S120, if the follow-up movement control, under which the virtual workpiece follows the motion of the virtual machine, is started, the simulation unit 806 displays the states of the virtual machine and the virtual workpiece, on which the follow-up movement control is reflected, in the 3D space on the monitor 907 by executing the 3D simulator. That is, for example, as the state in FIG. 6C, a state in which the virtual robot 500 holds the virtual workpiece 530 while the virtual workpiece 530 follows the motion of the virtual robot 500 is displayed in the 3D space on the monitor 907.

According to the first embodiment, the virtual workpiece is controlled to follow the motion of the virtual robot if a certain amount of the holding space of the virtual robot is occupied by the virtual workpiece. Therefore, simulation can be executed such that a workpiece which can be held by a robot in the real space is held, and a workpiece which cannot be held by the robot in the real space is not held. That is, it is possible to simulate the motion of the robot and the workpiece in the real space more accurately.

Second Embodiment

In the first embodiment, an example in which simulation is executed when a machine is a robot has been described. In the second embodiment, simulation in a case where the machine is an air cylinder will be described. A determination method for a follow-up condition different from the method described in FIG. 8 for the first embodiment is used in the second embodiment.

In the second embodiment, since "Overall Configuration of Control System", "Hardware Configuration of PC 6", and "Functional Configuration" are basically the same as the first embodiment, detailed description thereof will not be repeated.

<Functional Configuration of Simulation Unit>

Functions of a simulation unit 806 according to the second embodiment will be described. The functions of the simulation unit 806 are basically the same as in the first embodiment except that a function of a determination unit 824 in a simulation control unit 820 is slightly different. Therefore, detailed description thereof will not be repeated.

In the second embodiment, the determination unit 824 determines, based on model data of the virtual object, which is handled by the virtual machine and corresponds to a real object, and model data of the virtual machine, whether or not a volume of a region where a work space in which a virtual machine works overlaps with a virtual object (a below-described movable space in the second embodiment) is equal to or greater than a predetermined reference value. More specifically, the determination unit 824 divides the virtual object into a plurality of unit regions, and determines whether or not each of the divided unit regions is included in the work space. Then, the determination unit 824 calculates the volume of a portion of the virtual object that overlaps with the work space based on the number of the unit regions determined to be included in the work space.

<Flow of Simulation Control>

(Overview)

Figure 11:
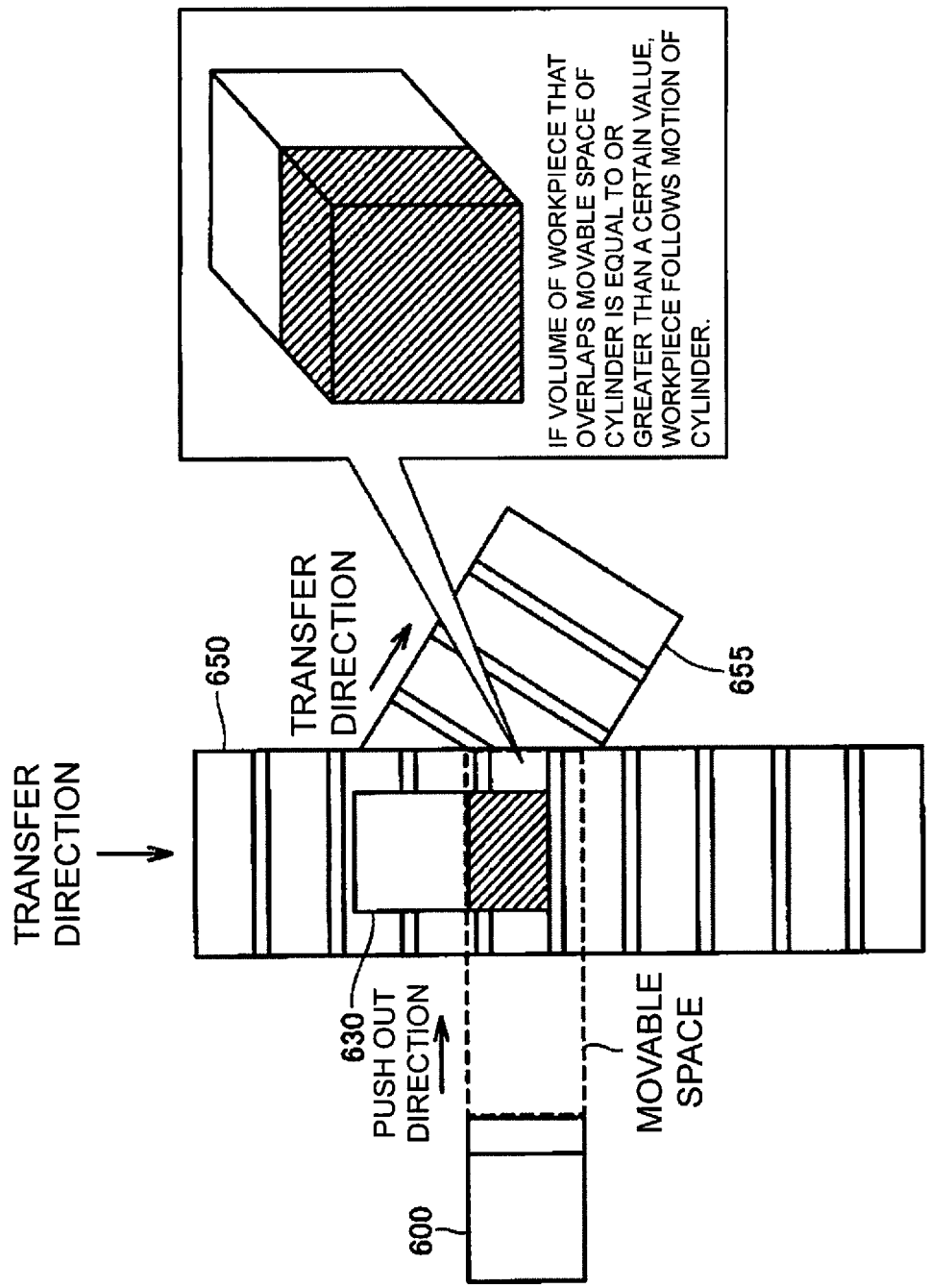
FIG. 11 is a diagram showing a 3D space of simulation according to a second embodiment.

FIG. 11 is a diagram showing a 3D space in a simulation of the second embodiment.

With reference to FIG. 11, in the second embodiment, a virtual air cylinder 600 corresponding to an air cylinder in the real space, a virtual workpiece 630 corresponding to a workpiece in the real space, and virtual conveyors 650 and 655 corresponding to conveyors in the real space are arranged in the 3D space which is a virtual space corresponding to the real space. More specifically, the virtual workpiece 630 is basically placed on the virtual conveyor 650, and with a belt of the virtual conveyor 650 being driven, moves along the direction to which the belt is driven (the transfer direction in FIG. 11). However, if a condition for the virtual workpiece 630 to follow the motion of the virtual air cylinder 600 is satisfied, when the virtual air cylinder 600 pushes out its piston to the right in FIG. 11 (thrust direction), the virtual workpiece 630 is pushed out to the right in FIG. 11. Then, the virtual workpiece 630 moves to the lower right in FIG. 11 while being placed on the virtual conveyor 655. An air cylinder typically has a mechanism to push out its piston by applying air pressure.

In summary, the simulation unit 806 displays objects (in the second embodiment, the virtual air cylinder 600, the virtual workpiece 630, and the virtual conveyors 650 and 655) in the 3D space by executing the 3D simulator. The 3D simulator determines whether or not the follow-up condition is satisfied for the virtual workpiece 630, which is handled by the virtual air cylinder 600, to follow the motion of the virtual air cylinder 600. More specifically, the 3D simulator makes the virtual workpiece 630 follow the motion of the virtual air cylinder 600 if a volume of a portion of the virtual workpiece 630 that overlaps with (is included in) a movable space of the virtual air cylinder 600 is equal to or greater than a certain value (if the follow-up condition is satisfied). That is, the 3D simulator starts the follow-up movement control under which the virtual workpiece 630 follows the motion of the virtual air cylinder 600.

The simulation unit 806 controls the virtual air cylinder 600 and the virtual conveyor 650 by executing the machine control simulator.

Figure 12A:
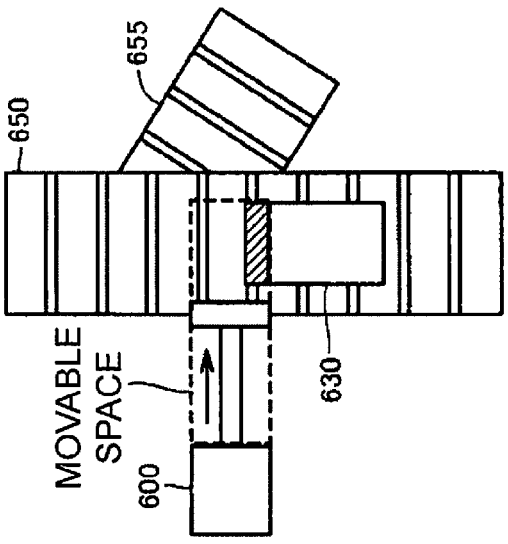
FIGS. 12A to 12C are diagrams showing states of the simulation according to the second embodiment.
Figure 12B:
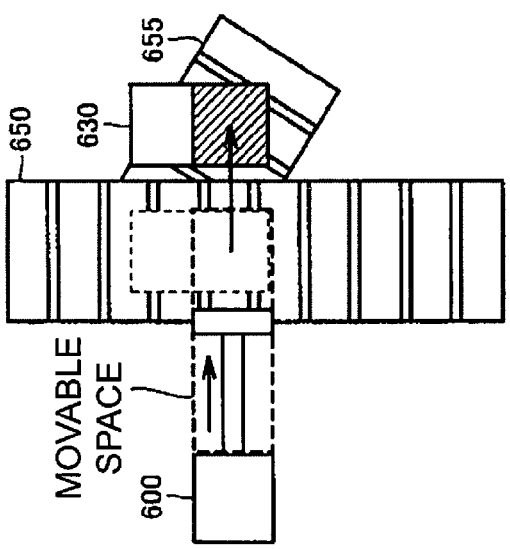
Figure 12C:
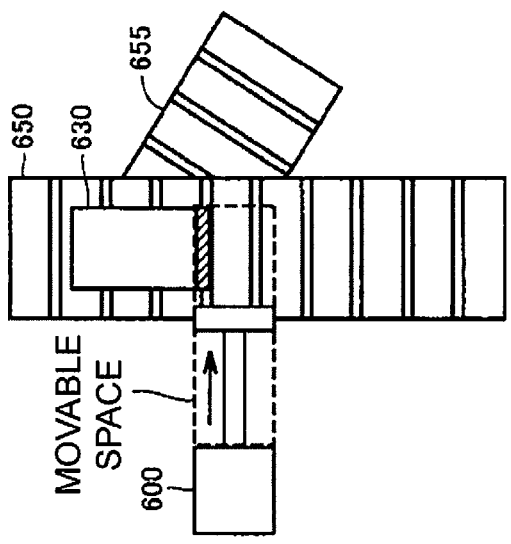

FIGS. 12A to 12C are diagrams showing states in the simulation according to the second embodiment.

With reference to FIGS. 12A to 12C, the virtual air cylinder 600 pushes out its piston to the right in FIGS. 12A to 12C following a motion command to push out the piston. In this case, if the virtual workpiece 630 is hardly included in a movable range (movable space) of (the piston of) the virtual air cylinder 600 (corresponding to states in FIGS. 12A and 12C), the virtual workpiece 630 does not move to the right even when the piston of the virtual air cylinder 600 is pushed out. If the virtual workpiece 630 is included in the movable space of the virtual air cylinder 600 by a certain amount or more (corresponding to the state in FIG. 12B), the virtual workpiece 630 moves to the right and is transferred by the virtual conveyor 655 when the piston of the virtual air cylinder 600 is pushed out. That is, if the volume of the portion of the virtual workpiece 630 included in the movable space is equal to or greater than a certain amount, the follow-up condition for the virtual workpiece 630 to follow the motion of the virtual air cylinder 600 is satisfied. The movable space of the virtual air cylinder 600 is set in advance to correspond to the movable space of the air cylinder in the real space.

The simulation result described above reflects the following states. In the real space, if a workpiece is hardly included in a movable space of an air cylinder (corresponding to the states in FIGS. 12A and 12C in the 3D space), the workpiece only changes its direction and is not pushed out even when the piston is pushed out. Also, if the workpiece is included in the movable space of the piston of the air cylinder by a certain amount or more (corresponding to the state in FIG. 12B in the 3D space), the workpiece is pushed out when the piston is pushed out.

(Follow-Up Condition Determination Processing)

A flow of the follow-up condition determination processing (processing equivalent to step S116 in FIG. 7) in the second embodiment will be described below. Because an overall flow of control of the simulation unit 806 is basically the same as the flow shown in FIG. 7 in the first embodiment, detailed description thereof will not be repeated.

Figure 13:
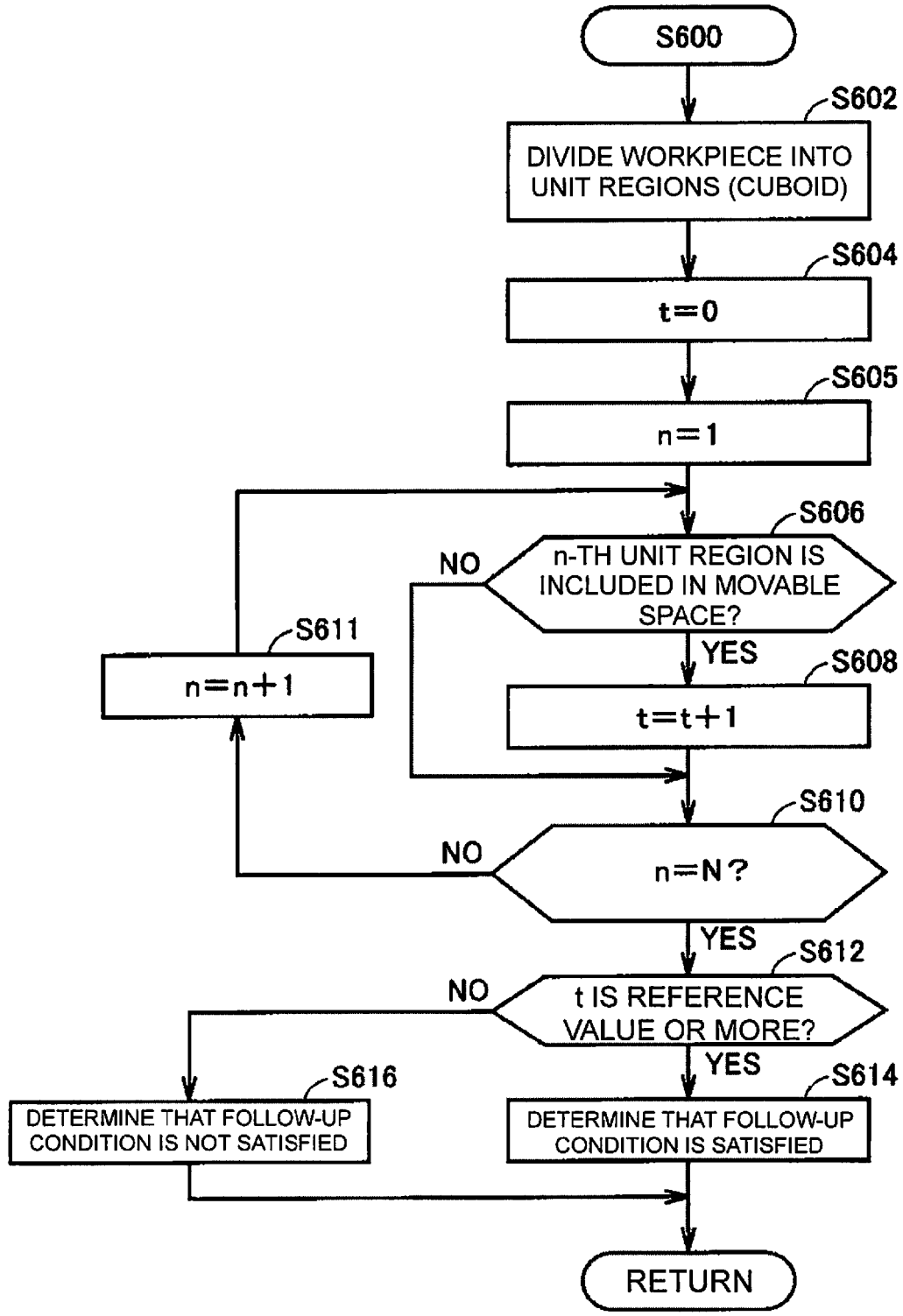
FIG. 13 is a flowchart showing a flow of determination processing of follow-up conditions according to the second embodiment.

FIG. 13 is a flowchart illustrating a flow of the determination processing of the follow-up conditions according to the second embodiment. Step S600 in the second embodiment corresponds to step S116 in the first embodiment.

With reference to FIG. 13, the simulation unit 806 divides the virtual workpiece 630 into a plurality of unit regions (e.g., a cuboid) with a predetermined size by executing the 3D simulator (step S602).

Figure 14:
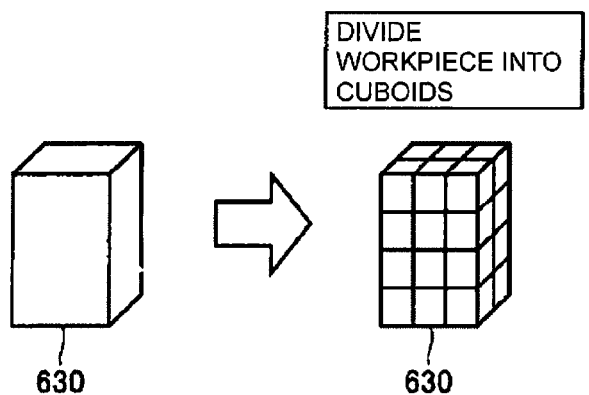
FIG. 14 is a diagram for illustrating a division method of a virtual workpiece according to the second embodiment.

FIG. 14 is a diagram for illustrating a division method of the virtual workpiece 630 according to the second embodiment.

With reference to FIG. 14, the simulation unit 806 divides the virtual workpiece 630 into a plurality of unit regions based on model data of the virtual workpiece 630. This example shows a case where the virtual workpiece 630 is divided into 24 unit regions.

Referring again to FIG. 13, the simulation unit 806 sets a variable t, which indicates the number of the unit regions that are included in the virtual air cylinder 600, to 0 (step S604). The variable t indicates the volume of a portion of the virtual workpiece 630 included in the movable space. For example, if the entire virtual workpiece 630 is included in the movable space, the value of the variable t is 24. If the virtual workpiece 630 does not exist in the movable space, the value of the variable t is 0.

Next, the simulation unit 806 sets 1 to a variable n, which is stored in a RAM 903 (step S605). In the second embodiment, the RAM 903 holds, as a variable N, the number of the unit regions into which the virtual workpiece 630 is divided. In other words, the variable N indicates the total volume of the virtual workpiece 630.

Next, the simulation unit 806 determines whether or not the n-th unit region is included in the movable space (step S606).

Figure 15:
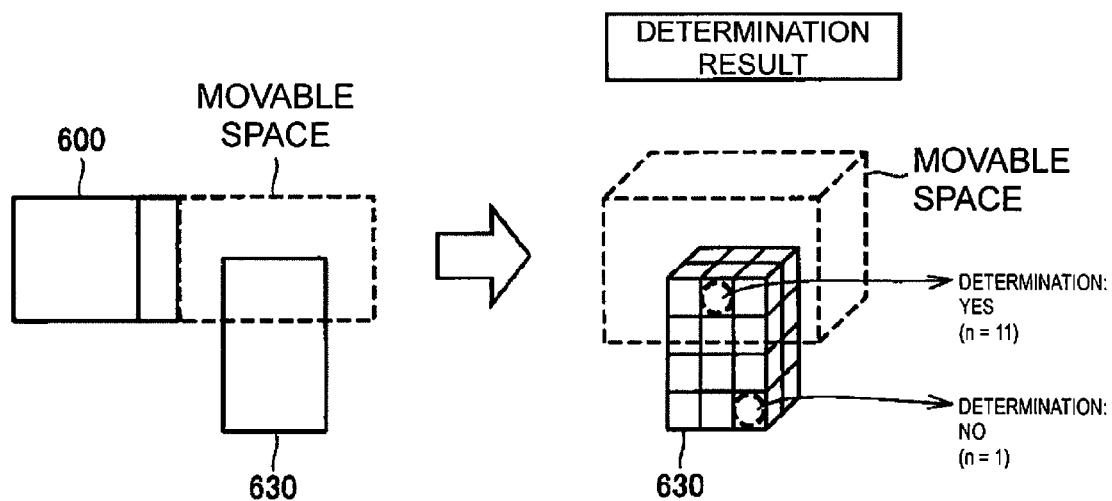
FIG. 15 is a diagram for illustrating a determination processing method in step S606 shown in FIG. 14.

FIG. 15 is a diagram for illustrating a determination processing method in step S606 shown in FIG. 14. With reference to FIG. 15, the simulation unit 806 determines that, for example, the 11th (n=11) unit region is included in the movable space, and the 1st (n=1) unit region is not included in the movable space.

Referring again to FIG. 13, if the n-th unit region is not included in the movable space (NO in step S606), the simulation unit 806 executes the processing in step S610. If the n-th unit region is included in the movable space (YES in step S606), the simulation unit 806 increments the value of the variable t (step S608) and executes the processing in step S610.

Next, the simulation unit 806 determines whether or not the variable n matches the variable N (step S610). More specifically, the simulation unit 806 determines whether or not the determination processing in step S606 is executed for all unit regions.

If the variable n does not match with the variable N (NO in step S610), the simulation unit 806 increments the value of the variable n (step S611) and repeats the processing from step S606. On the other hand, if the variable n matches the variable N (YES in step S610), the simulation unit 806 determines whether or not the value of the variable t is equal to or greater than a predetermined reference value (step S612). More specifically, for example, if the follow-up condition is that 50% or more of the volume of the virtual workpiece 630 is included in the movable space, the reference value is set to half the volume of the virtual workpiece 630. In this case, the reference value is set to 12 since the volume of the virtual workpiece 630 is 24.

If the value of the variable t is equal to or greater than the reference value (YES in step S612), the simulation unit 806 determines that the follow-up condition is satisfied (step S614) and returns the process to the main process (Return). On the other hand, if the value of the variable t is not equal to or greater than (i.e., is less than) the reference value (NO in step S612), the simulation unit 806 determines that the follow-up condition is not satisfied (step S616) and returns the process to the main process (Return).

As in the first embodiment, the volume of a portion of the virtual workpiece 630 that is not included in the movable space may be calculated. More specifically, if it is determined that the n-th unit region is not included in the movable space, the simulation unit 806 increments a variable i indicating the volume not included in the movable space. In this case, the simulation unit 806 determines that the follow-up condition is satisfied if the value of the variable i is less than the reference value, and that the follow-up condition is not satisfied if the value of the variable i is equal to or greater than the reference value.

The determination on the follow-up condition may be made by changing the reference value in step S606, depending on specifications such as a shape (e.g., sphere, cuboid, or trigonal pyramid), type, weight, and the like of the virtual workpiece 630. More specifically, the simulation unit 806 may execute the processing in step S612 based on the reference value, which has been stored in advance as model data for each virtual workpiece 630.

By executing a determination processing for the follow-up condition as described above, it becomes possible to simulate motion of an air cylinder and a workpiece in the real space more accurately in a virtual space. As a comparative example of the determination processing for the follow-up condition according to the second embodiment, a case will be described where the virtual workpiece 630 follows the motion of the virtual air cylinder 600 if the distance between the virtual air cylinder 600 and the virtual workpiece 630 becomes equal to or less than a certain value.

FIGS. 16A to 16C are diagrams showing states in simulation of a comparative example.

With reference to FIGS. 16A to 16C, the virtual air cylinder 600 pushes out its piston to the right in FIGS. 16A to 16C following a motion command to push out the piston. In this case, a shortest distance d between the virtual air cylinder 600 and the virtual workpiece 630 is the same for all the states in FIGS. 16A to 16C. That is, if the virtual workpiece 630 is included in the movable space of the virtual air cylinder 600 even just a little, the shortest distance d takes the same value. Because the follow-up condition is satisfied when the shortest distance d is equal to or less than a certain distance, the virtual workpiece 630 follows the motion of the virtual air cylinder 600. Therefore, all the states in FIGS. 16A to 16C show a state in which the virtual workpiece 630 moves to the right when the piston of the virtual air cylinder 600 is pushed out to the right is shown.

Therefore, in the above comparative example, the simulation result shows that the virtual workpiece 630 is pushed out following the motion of the virtual air cylinder 600 in the states in FIGS. 16A and 16C, although actually (i.e. in the real space), a workpiece is not properly pushed out (only changes its direction) when the piston is pushed out if the workpiece is hardly included in a movable range of an air cylinder (states in FIGS. 16A and 16C). Therefore, in the comparative example, it can be seen that the motion of the air cylinder and the workpiece in the real space is not simulated with high accuracy.

On the other hand, in the determination processing of the follow-up condition according to the second embodiment, the motion of the air cylinder and the workpiece in the real space can be simulated more accurately as shown in FIGS. 12A to 12C. Moreover, in the second embodiment, because the follow-up condition is determined based on the volume of a portion of the virtual workpiece 630 included in the movable space, a simulation result does not depend on the shape of the virtual workpiece 630 or the direction of the transferred virtual workpiece 630. Accordingly, it becomes possible to simulate the motion of the virtual machine and the virtual workpiece more accurately.

(Modification of Follow-Up Condition Determination Processing)

Similarly to the case where a holding space is divided into unit regions in the first embodiment, a case where the movable space in the second embodiment is divided into unit regions may be adopted as a modification. That is, the simulation unit 806 divides the movable space of the virtual air cylinder 600 into unit regions (e.g., a cuboid) by executing the 3D simulator.

Figure 17:
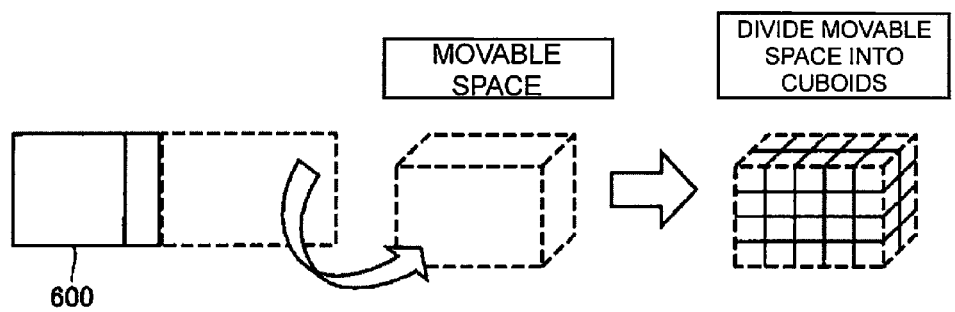
FIG. 17 is a diagram for illustrating a division method of a movable space of a virtual air cylinder according to a modification of the second embodiment.

FIG. 17 is a diagram for illustrating a division method of the movable space of the virtual air cylinder 600 according to the modification of the second embodiment.

With reference to FIG. 17, the simulation unit 806 divides the movable space of the virtual air cylinder 600 into a plurality of unit regions (e.g., a cuboid) based on model data of the virtual air cylinder 600. This example shows a case where the movable space is divided into 40 unit regions.

In the above case, the simulation unit 806 determines whether or not the n-th unit region includes the virtual workpiece 630.

Figure 18:
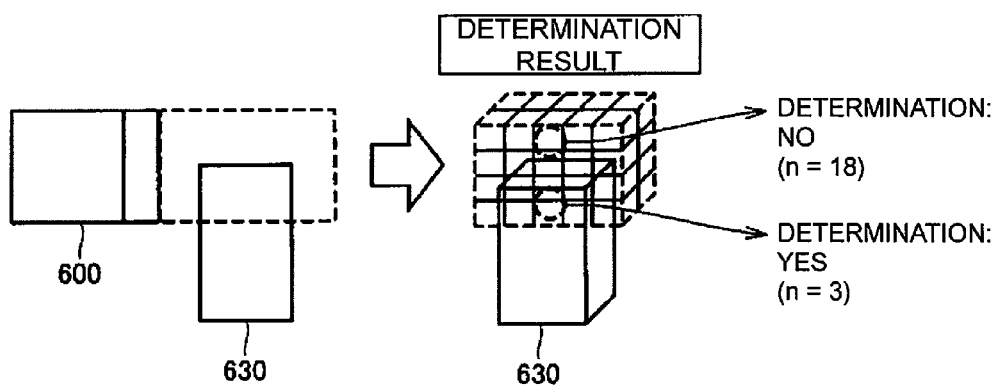
FIG. 18 is a diagram for illustrating a determination method to determine whether or not a unit region according to the modification of the second embodiment includes a virtual workpiece.

FIG. 18 is a diagram for illustrating a determination method to determine whether or not a unit region according to the modification of the second embodiment includes the virtual workpiece 630.

With reference to FIG. 18, for example, the simulation unit 806 determines that the 3rd (n=3) unit region includes the virtual workpiece 630, and the 18th (n=18) unit region does not include the virtual workpiece 630.

Third Embodiment

In the first embodiment, an example has been described in which a space is divided into cuboids as unit regions in the follow-up condition determination processing illustrated in FIG. 8. In the third embodiment, a case will be described where a surface of a virtual workpiece 530 is divided into a plurality of unit regions (e.g., rectangles) in the follow-up condition determination processing.

In the third embodiment, because "Overall Configuration of Control System", "Hardware Configuration of PC 6", and "Functional Configuration" are basically the same as in the first embodiment, detailed description thereof will not be repeated. That is, a follow-up condition different from the condition described in FIG. 8 for the first embodiment is used in the third embodiment.

<Functional Configuration of Simulation Unit>

Functions of a simulation unit 806 according to the third embodiment will be described. The functions of the simulation unit 806 are basically the same as in the first embodiment except that a function of a determination unit 824 in a simulation control unit 820 is slightly different. Therefore, detailed description thereof will not be repeated.

In the third embodiment, a determination unit 824 determines, based on model data of the virtual object and model data of the virtual machine, whether or not a surface area of a virtual object where a work space in which a virtual machine works (in the third embodiment, a holding space) overlaps with a virtual object, which is handled by the virtual machine and corresponds to a real object, is equal to or greater than a reference value. More specifically, the determination unit 824 divides the surface of the virtual object into a plurality of unit regions, and determines whether or not each of the divided unit regions is included in the work space. Then, out of the total volume of the virtual object, the determination unit 824 calculates a surface area of a portion of the virtual object that overlaps with the work space based on the number of the unit regions determined to be included in the work space.

<Flow of Simulation Control>

In the third embodiment, a case shown in FIG. 5 in the first embodiment is assumed. Since an overall flow of control of the simulation unit 806 is basically the same as the flow shown in FIG. 7 in the first embodiment, details thereof will not be repeated.

A flow of the follow-up condition determination processing (the part corresponding to step S116 in FIG. 7) of the third embodiment will be described below.

(Follow-Up Condition Determination Processing)

Figure 19:
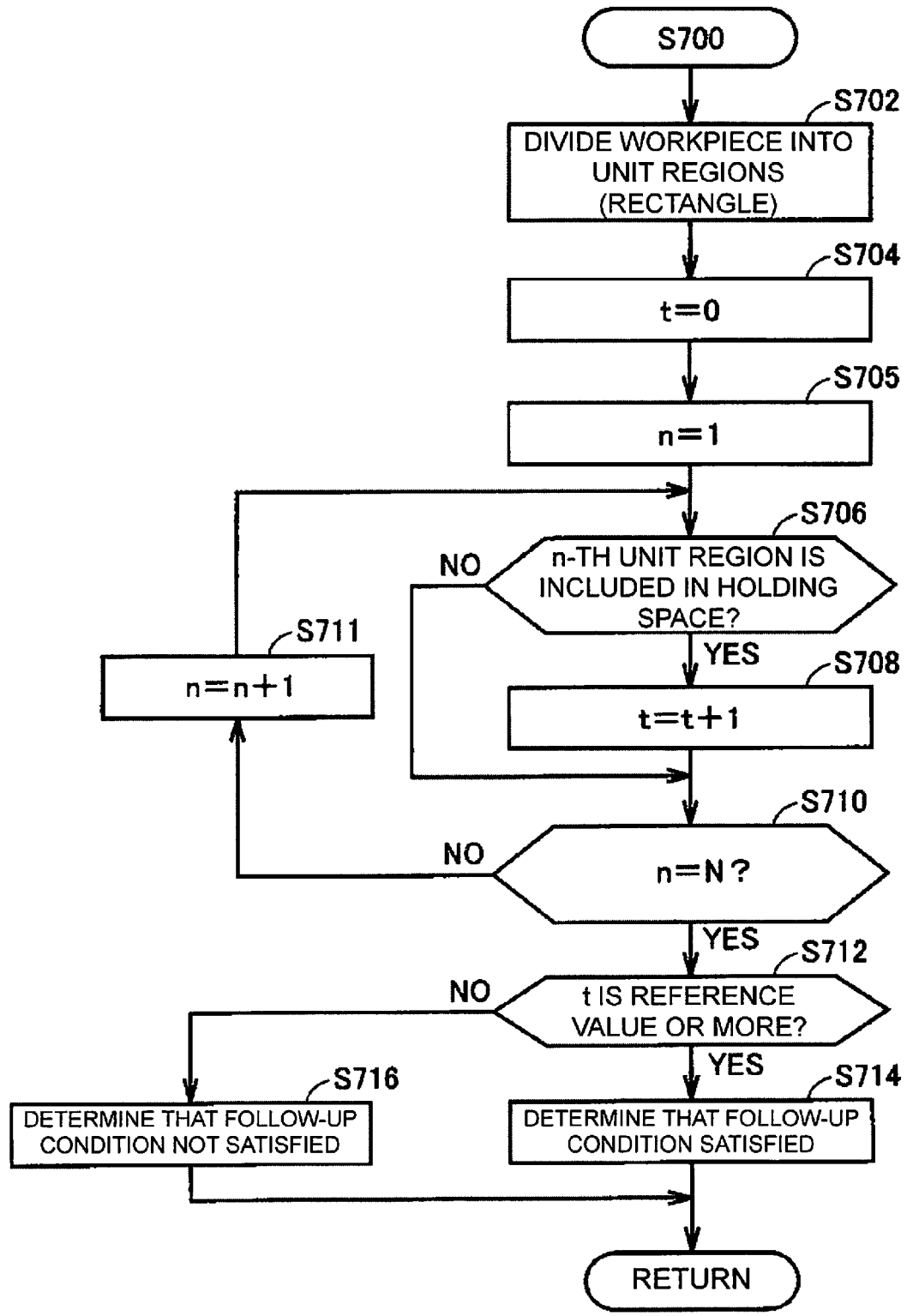
FIG. 19 is a flowchart showing a flow of determination processing of follow-up conditions according to a third embodiment.

FIG. 19 is a flowchart showing a flow of the follow-up condition determination processing according to the third embodiment. Step S700 in the third embodiment corresponds to step S116 in the first embodiment.

With reference to FIG. 19, the simulation unit 806 divides the surface of the virtual workpiece 530 into a plurality of unit regions (e.g., rectangles) with a predetermined size by executing the 3D simulator (step S702).

Figure 20:
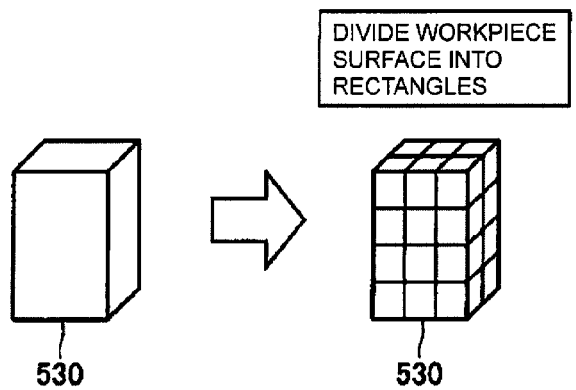
FIG. 20 is a diagram for illustrating a division method of a virtual workpiece according to the third embodiment.

FIG. 20 is a diagram for illustrating a division method of the virtual workpiece 530 according to the third embodiment.

With reference to FIG. 20, the simulation unit 806 divides the surface of the virtual workpiece 530 into a plurality of unit regions based on model data of the virtual workpiece 530. This example shows a case where the surface is divided into 52 unit regions.

Referring again to FIG. 19, the simulation unit 806 sets a variable t, which indicates the number of the unit regions included in a holding space of a virtual robot 500, to 0 (step S704). The variable t indicates the surface area of a portion of the virtual workpiece 530 that is included in the holding space. For example, if the entire surface of the virtual workpiece 530 is included in the holding space, the value of the variable t is 52. If the virtual workpiece 530 is not included in the holding space at all, the value of the variable t is 0.

Next, the simulation unit 806 sets 1 to a variable n, which is stored in a RAM 903 (step S705). In the third embodiment, the RAM 903 holds, as a variable N, the number of the unit regions into which the surface of the virtual workpiece 530 is divided. In other words, the variable N indicates the total surface area of the virtual workpiece 530.

Next, the simulation unit 806 determines whether or not the n-th unit region is included in the holding space (step S706).

Figure 21:
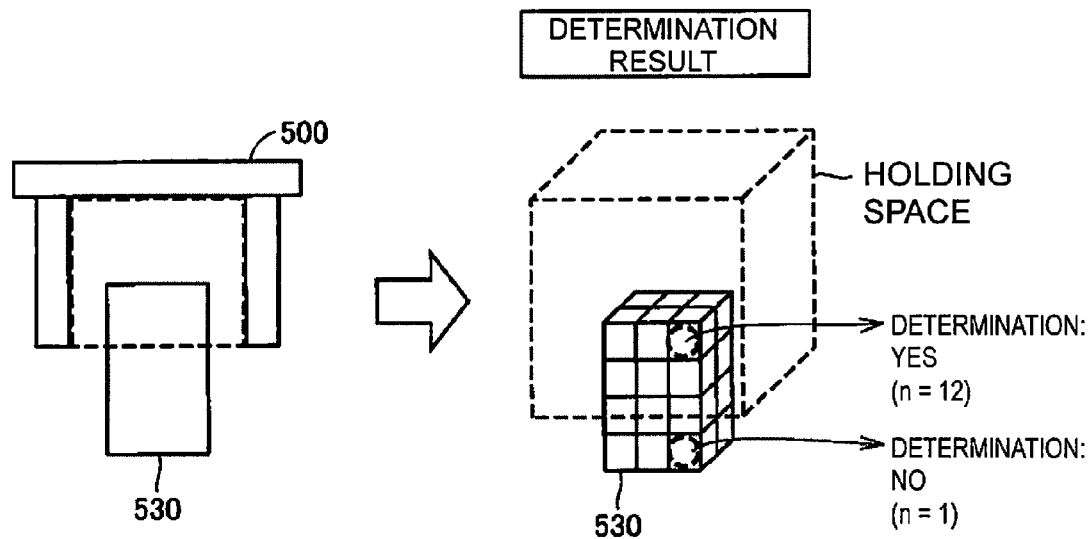
FIG. 21 is a diagram for illustrating a determination processing method in step S706 shown in FIG. 20.

FIG. 21 is a diagram for illustrating a determination processing method in step S706 shown in FIG. 20.

With reference to FIG. 21, for example, the simulation unit 806 determines that the 12th (n=12) unit region is included in the holding space, and the 1st (n=1) unit region is not included in the holding space.

Referring again to FIG. 19, if the n-th unit region is not included in the holding space (NO in step S706), the simulation unit 806 executes the processing in step S710. On the other hand, if the n-th unit region is included in the holding space (YES in step S706), the simulation unit 806 increments the value of the variable t (step S708) and executes the processing in step S710.

Next, the simulation unit 806 determines whether or not the variable n matches the variable N (step S710). More specifically, the simulation unit 806 determines whether or not the determination processing in step S706 is executed for all unit regions.

If the variable n does not match with the variable N (NO in step S710), the simulation unit 806 increments the value of the variable n (step S711) and repeats the processing from step S706. On the other hand, if the variable n matches the variable N (YES in step S710), the simulation unit 806 determines whether or not the value of the variable t is equal to or greater than a reference value (step S712). More specifically, for example, if the follow-up condition is that 50% or more of the surface of the virtual workpiece 530 is included in the holding space, the reference value is set to half the surface area of the virtual workpiece 530. In this case, the reference value is set to 26 because the surface area of the virtual workpiece 530 is 52.

If the value of the variable t is equal to or greater than the reference value (YES in step S712), the simulation unit 806 determines that the follow-up condition is satisfied (step S714) and returns the process to the main process (Return). On the other hand, if the value of the variable t is not equal to or greater than (less than) the reference value (NO in step S712), the simulation unit 806 determines that the follow-up condition is not satisfied (step S716) and returns the process to the main process (Return).

According to the third embodiment, if a certain amount of the surface of the virtual workpiece is included in the holding space of the virtual robot, the virtual workpiece is controlled to follow the motion of the virtual robot. Therefore, the simulation can be executed such that a workpiece which can be held by a robot in the real space is held, and a workpiece which cannot be held by the robot in the real space is not held. That is, it becomes possible to simulate the motion of a robot and a workpiece in the real space more accurately.

Other Embodiments

In the first embodiment, although a case has been described where a holding space is divided into unit regions in follow-up condition determination processing, a virtual workpiece 530 may also be divided into unit regions in a manner similar to the second embodiment. That is, a simulation unit 806 divides a virtual workpiece 530 into unit regions (e.g., a cuboid) by executing a 3D simulator. The simulation unit 806 determines whether or not the n-th unit region is included in a holding space. The simulation unit 806 determines that a follow-up condition is satisfied if a volume of a portion of the virtual workpiece 530 is equal to or greater than a certain value, and that the follow-up condition is not satisfied if it is less than a reference value.

In the above embodiments, it is assumed that a virtual machine corresponds to a machine in the real space and a virtual object corresponds to an object (workpiece) in the real space. However, the invention is not limited thereto, and the virtual object may exist only in a 3D space which is a virtual space. Accordingly, for example, whether or not an object follows the motion of a machine can be examined in the simulation of a control program prior to the actual construction of an apparatus.

In the above embodiments, it is described that a simulator executed by the simulation unit 806 is formed of two parts, a 3D simulator and a machine control simulator. However, the invention is not limited thereto, and these two simulators may be integrated into a simulator. With this configuration, simulation can be executed more efficiently because data exchange between these two simulators is not necessary.

There can also be provided a program that carries out the control described in the above-described flowchart by making a computer to work. Such a program can be recorded in a non-temporary computer-readable recording medium, such as a floppy disk, CD-ROM, ROM, RAM, and memory card, which accompany a computer, and is provided as a program product. Alternatively, the program can be provided by being recorded in the recording medium such as a hard disk that is built into a computer. The program can also be provided by downloading via a network.

The program may be a program that calls out necessary modules in a predetermined arrangement at a predetermined timing out of program modules provided as a part of a computer operating system (OS) to execute processing. In this case, the above-described modules are not included in the program itself, and the program executes processing in cooperation with the OS. Such a program that does not include modules in itself may be included in the program according to this embodiment.

The program according to this embodiment may be a program that is provided by being incorporated in a part of other program. In this case, the above-described program modules included in other programs are not included in the program itself, and the program executes processing in cooperation with the other programs. Such a program incorporated in another program can be included in the program according to this embodiment.

It should be understood that the embodiments disclosed are illustrative and not restrictive in all respects. The scope of the invention is shown not by the above descriptions, but only by claims of the invention, and it is intended that the meanings equivalent to claims and all the modifications within claims are included in the invention.

What is claimed is:

1. A simulation apparatus comprising:
a processor configured with a simulation program that causes the processor to execute a simulation of the operations of a controller to execute a control program on the controller to control a motion of a machine that handles an object in a real space, wherein
the processor is configured with the simulation program to perform operations comprising:
operation as a motion control unit configured to control, in accordance with the control program, a motion of a virtual machine in a virtual space based on a motion command to move the virtual machine in the virtual space, the virtual machine in the virtual space corresponding to the machine in the real space;
operation as a determination unit configured to determine, based on model data of a virtual object and model data of the virtual machine, whether a volume of an overlap portion, where a virtual work space in which the virtual machine works in the virtual space overlaps with the virtual object, is equal to or greater than a predetermined reference value, the virtual object being handled by the virtual machine in the virtual space and corresponding to the object in the real space; and
operation as a follow-up unit configured to make the virtual object follow the motion of the virtual machine in the virtual space based on the motion command when the volume is equal to or greater than the reference value.

2. The simulation apparatus according to claim 1, wherein the processor is configured with the simulation program to perform operations such that operation as the determination unit further comprises operation as the determination unit configured to
divide the virtual work space into a plurality of unit regions,
determine whether each of the divided plurality of unit regions is overlapped with the virtual object, and
calculate the volume of the overlap portion of the virtual work space overlapped with the virtual object based on a number of the unit regions determined to be overlapped with the virtual object.

3. The simulation apparatus according to claim 1, wherein the processor is configured with the simulation program to perform operations such that operation as the determination unit further comprises operation as the determination unit configured to
divide the virtual object into a plurality of unit regions,
determine whether each of the divided plurality of unit regions is overlapped with the virtual work space, and
calculate the volume of the overlap portion of the virtual object overlapped with the virtual work space based on a number of the unit regions determined to be overlapped with the virtual work space.

4. The simulation apparatus according to claim 3, wherein the reference value is defined for each piece of the model data of the virtual object.

5. The simulation apparatus according to claim 1, wherein the virtual work space comprises a virtual movable range of the virtual machine, the virtual movable range being predetermined to correspond to a movable range of the machine in the real space.

6. A simulation method performed on a computer comprising a processor configured with a simulation program that causes the processor to execute a simulation of the operations of a controller to execute a control program on the controller to control a motion of a machine that handles an object in a real space, the method comprising:
causing the processor to control, in accordance with the control program, the motion of a virtual machine in a virtual space based on a motion command to move the virtual machine in the virtual space, the virtual machine in the virtual space corresponding to the machine in the real space;
causing the processor to determine, based on model data of a virtual object and model data of the virtual machine, whether a volume of an overlap portion, where a virtual work space in which the virtual machine works in the virtual space overlaps with the virtual object, is equal to or greater than a predetermined reference value, the virtual object being handled by the virtual machine in the virtual space and corresponding to the object in the real space; and
causing the processor to make the virtual object follow the motion of the virtual machine in the virtual space based on the motion command when the volume is equal to or greater than the reference value.

7. A non-transitory computer readable medium having a simulation program stored thereon, the simulation program, when executed by a computer comprising a processor, causes the processor to execute a simulation of the operations of a controller to execute a control program on the controller to control a motion of a machine that handles an object in a real space,
the simulation program further causing the processor to perform operations comprising:
controlling, in accordance with the control program, a motion of a virtual machine in a virtual space based on a motion command to move the virtual machine in the virtual space, the virtual machine in the virtual space corresponding to the machine in the real space;
determining, based on model data of a virtual object and model data of the virtual machine, whether a volume of an overlap portion, where a virtual work space in which the virtual machine works in the virtual space overlaps with the virtual object, is equal to or greater than a predetermined reference value, the virtual object being handled by the virtual machine in the virtual space and corresponding to the object in the real space; and making the virtual object follow the motion of the virtual machine in the virtual space based on the motion command when the volume is equal to or greater than the reference value.

8. A simulation apparatus comprising:
a processor configured with a simulation program that causes the processor to execute a simulation of the operations of a controller to execute a control program on the controller to control a motion of a machine that handles an object in a real space, wherein
the processor is configured with the simulation program to perform operations comprising:
   operation as a motion control unit configured to control, in accordance with the control program, a motion of a virtual machine in a virtual space based on a motion command to move the virtual machine in the virtual space, the virtual machine in the virtual space corresponding to the machine in the real space;
   operation as a determination unit configured to determine, based on model data of a virtual object and model data of the virtual machine, whether a surface area of an overlap portion of the virtual object, where a virtual work space in which the virtual machine works overlaps with the virtual object, is equal to or greater than a predetermined reference value, the virtual object being handled by the virtual machine in the virtual space and corresponding to the object in the real space; and
   operation as a follow-up unit configured to make the virtual object follow the motion of the virtual machine based on the motion command when the surface area is equal to or greater than the reference value.

9. The simulation apparatus according to claim 8, wherein
the processor is configured with the simulation program to perform operations such that operation as a determining unit configured to determine, based on the model data of the virtual object and the model data of the virtual machine, whether the surface area of the overlap portion, where the virtual work space in which the virtual machine works in the virtual space overlaps with the virtual object, is equal to or greater than the predetermined reference value comprises operation as the determining unit configured to:
   divide a surface of the virtual work space into a plurality of unit regions,
   determine whether each of the divided plurality of unit regions is overlapped with the virtual object, and
   calculate the surface area of the overlap portion of the virtual work space overlapped with the virtual object based on a number of the unit regions determined to be overlapped with the virtual object.

10. The simulation apparatus according to claim 8, wherein
the processor is configured with the simulation program to perform operations such that operation as a determining unit configured to determine, based on the model data of the virtual object and the model data of the virtual machine, whether the surface area of the overlap portion, where the virtual work space in which the virtual machine works in the virtual space overlaps with the virtual object, is equal to or greater than the predetermined reference value comprises operation as the determining unit configured to:
   divide a surface of the virtual object into a plurality of unit regions,
   determine whether each of the divided unit regions is overlapped with the virtual work space, and
   calculate the surface area of the overlap portion of the virtual object overlapped with the virtual work space based on a number of the unit regions determined to be-overlapped with the virtual work space.

11. The simulation apparatus according to claim 10, wherein
the reference value is defined for each piece of the model data of the virtual object.

12. The simulation apparatus according to claim 8, wherein
the virtual work space comprises a virtual movable range of the virtual machine, the virtual movable range being predetermined to correspond to a movable range of the machine in the real space.

13. A simulation apparatus comprising:
a processor configured with a simulation program that causes the processor to execute a simulation of the operations of a controller to execute a control program on the controller to control a motion of a machine that handles an object in a real space, wherein
the processor is configured with the simulation program to perform operations comprising:
   operation as a motion control unit configured to control, in accordance with the control program, a motion of a virtual machine in a virtual space based on a motion command to move the virtual machine in the virtual space, the virtual machine in the virtual space corresponding to the machine in the real space;
   operation as a determination unit configured to determine, based on model data of a virtual object and model data of the virtual machine, whether or not a volume of a non-overlap portion, where a virtual work space in which the virtual machine works does not overlap with the virtual object, is less than a predetermined reference value, the virtual object being handled by the virtual machine in the virtual space and corresponding to the object in the real space; and
   operation as a follow-up unit configured to make the virtual object follow the motion of the virtual machine based on the motion command when the volume is less than the reference value.

14. The simulation apparatus according to claim 13, wherein
the processor is configured with the simulation program to perform operations such that operation as the determination unit further comprises operation as the determination unit configured to determine, based on the model data of the virtual object and the model data of the virtual machine, whether or not the volume of the non-overlap portion, where the virtual work space in which the virtual machine works does not overlap with the virtual object, is less than the predetermined reference value comprises operation as the determining unit configured to
   divide the virtual work space into a plurality of unit regions,
   determine whether each of the divided plurality of unit regions is not overlapped with the virtual object, and calculate the volume of the non-overlap portion of the virtual work space being not overlapped with the virtual object based on a number of the unit regions determined to be not overlapped with the virtual object.

15. The simulation apparatus according to claim 13, wherein
the processor is configured with the simulation program to perform operations such that operation as the determination unit further comprises operation as the determination unit configured to determine, based on the model data of the virtual object and the model data of the virtual machine, whether or not the volume of the non-overlap portion, where the virtual work space in which the virtual machine works does not overlap with the virtual object, is less than the predetermined reference value comprises operation as the determining unit configured to
divide the virtual object into a plurality of unit regions,
determine whether each of the divided unit regions is not overlapped with the virtual work space, and
calculate the volume of the non-overlap portion of the virtual object being not overlapped with the virtual work space based on a number of the unit regions determined to be not overlapped with the virtual work space.

16. The simulation apparatus according to claim 15, wherein
the reference value is defined for each piece of the model data of the virtual object.

17. The simulation apparatus according to claim 13, wherein
the virtual work space comprises a virtual movable range of the virtual machine, the virtual movable range being predetermined to correspond to a movable range of the machine in the real space.

18. A simulation method performed on a computer comprising a processor configured with a simulation program that causes the processor to execute a simulation of the operations of a controller to execute a control program on the controller to control a motion of a machine that handles an object in a real space, the method comprising:
causing the processor to control, in accordance with the control program, the motion of a virtual machine in a virtual space based on a motion command to move the virtual machine in the virtual space, the virtual machine in the virtual space corresponding to the machine in the real space;
causing the processor to determine, based on model data of a virtual object and model data of the virtual machine, whether a surface area of an overlap portion, where a virtual work space in which the virtual machine works in the virtual space overlaps with the virtual object, is equal to or greater than a predetermined reference value, the virtual object being handled by the virtual machine in the virtual space and corresponding to the object in the real space; and
causing the processor to make the virtual object follow the motion of the virtual machine in the virtual space based on the motion command when the surface area is equal to or greater than the reference value.

19. A non-transitory computer readable medium having a simulation program stored thereon, the simulation program, when executed by a computer comprising a processor causes the processor to execute a simulation of the operations of a controller to execute a control program on the controller to control a motion of a machine that handles an object in a real space,
the simulation program further causing the processor to perform operations comprising:
controlling, in accordance with the control program, a motion of a virtual machine in a virtual space based on a motion command to move the virtual machine in the virtual space, the virtual machine in the virtual space corresponding to the machine in the real space;
determining, based on model data of a virtual object and model data of the virtual machine, whether a surface area of an overlap portion, where a virtual work space in which the virtual machine works in the virtual space overlaps with the virtual object, is equal to or greater than a predetermined reference value, the virtual object being handled by the virtual machine in the virtual space and corresponding to the object in the real space; and
making the virtual object follow the motion of the virtual machine in the virtual space based on the motion command when the surface area is equal to or greater than the reference value.

20. A simulation method performed on a computer comprising a processor configured with a simulation program that causes the processor to execute a simulation of the operations of a controller to execute a control program on the controller to control a motion of a machine that handles an object in a real space, the method comprising:
causing the processor to control, in accordance with the control program, the motion of a virtual machine in a virtual space based on a motion command to move the virtual machine in the virtual space, the virtual machine in the virtual space corresponding to the machine in the real space;
causing the processor to determine, based on model data of a virtual object and model data of the virtual machine, whether or not a volume of a non-overlap portion, where a virtual work space in which the virtual machine works in the virtual space does not overlap with the virtual object, is less than a predetermined reference value, the virtual object being handled by the virtual machine in the virtual space and corresponding to the object in the real space; and
causing the processor to make the virtual object follow the motion of the virtual machine in the virtual space based on the motion command when the volume is less than the reference value.

21. A non-transitory computer readable medium having a simulation program stored thereon, the simulation program, when executed by a computer comprising a processor causes the processor to execute a simulation of the operations of a controller to execute a control program on the controller to control a motion of a machine that handles an object in a real space,
the simulation program further causing the processor to perform operations comprising:
controlling, in accordance with the control program, a motion of a virtual machine in a virtual space based on a motion command to move the virtual machine in the virtual space, the virtual machine in the virtual space corresponding to the machine in the real space;
determining, based on model data of a virtual object and model data of the virtual machine, whether or not a volume of a non-overlap portion, where a virtual work space in which the virtual machine works in the virtual space does not overlap with the virtual object, is less than a predetermined reference value, the virtual object being handled by the virtual machine in the virtual space and corresponding to the object in the real space; and making the virtual object follow the motion of the virtual machine in the virtual space based on the motion command when the volume is less than the reference value.

* * * * *